(12) United States Patent
Jung et al.

(10) Patent No.: US 11,256,605 B2
(45) Date of Patent: Feb. 22, 2022

(54) NONVOLATILE MEMORY DEVICE

(71) Applicant: SAMSUNG ELECTRONICS CO., LTD., Suwon-si (KR)

(72) Inventors: Bong-Kil Jung, Seoul (KR); Hyunggon Kim, Hwaseong-si (KR); Donghoon Jeong, Gyeongsangnam-do (KR); Myung-Hoon Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/991,354

(22) Filed: Aug. 12, 2020

(65) Prior Publication Data

US 2020/0379884 A1 Dec. 3, 2020

Related U.S. Application Data

(63) Continuation-in-part of application No. 15/981,443, filed on May 16, 2018, now Pat. No. 10,761,969.

(30) Foreign Application Priority Data

Oct. 19, 2017 (KR) ........................ 10-2017-0136042

(51) Int. Cl.
*G06F 11/36* (2006.01)
*G06F 11/30* (2006.01)
*G11C 16/08* (2006.01)
*G11C 7/10* (2006.01)
*G11C 7/22* (2006.01)

(52) U.S. Cl.
CPC ...... *G06F 11/3656* (2013.01); *G06F 11/3037* (2013.01); *G11C 7/106* (2013.01); *G11C 7/1087* (2013.01); *G11C 7/222* (2013.01); *G11C 16/08* (2013.01)

(58) Field of Classification Search
CPC .................................................. G06F 11/3656
USPC ................................ 714/703, 702, 706, 707
See application file for complete search history.

(56) References Cited

U.S. PATENT DOCUMENTS

| 6,493,833 | B1 | 12/2002 | Utsumi |
| 6,963,963 | B2 | 11/2005 | Moyer |
| 7,590,891 | B2 | 9/2009 | Ishihara |

(Continued)

FOREIGN PATENT DOCUMENTS

| JP | 2006-293824 A | 10/2006 |
| JP | 2011-28308 A | 2/2011 |

(Continued)

*Primary Examiner* — Fritz Alphonse
(74) *Attorney, Agent, or Firm* — Volentine, Whitt & Francos, PLLC

(57) ABSTRACT

A nonvolatile memory device includes a memory cell region including first metal pads, and a peripheral circuit region. The peripheral circuit region includes second metal pads, a signal storage circuit that stores control signals and a data signal received from external of the nonvolatile memory device, a debugging information generator that generates debugging information based on the stored control signals and the stored data signal, and a debugging information register that outputs the debugging information in response to a debugging information external of the nonvolatile memory device. The peripheral circuit region is vertically connected to the memory cell region by the first metal pads and the second metal pads.

20 Claims, 21 Drawing Sheets

(56) References Cited

U.S. PATENT DOCUMENTS

| | | |
|---|---|---|
| 7,945,825 B2 | 5/2011 | Cohen et al. |
| 8,120,960 B2 | 2/2012 | Varkony |
| 8,407,457 B2 | 3/2013 | Moyer |
| 8,706,955 B2 | 4/2014 | Fai et al. |
| 8,806,446 B2 | 8/2014 | Kilbane |
| 8,874,883 B2 | 10/2014 | Williams |
| 8,972,955 B2 | 3/2015 | Feiveson et al. |
| 9,632,137 B2 | 4/2017 | Ramsay et al. |
| 2015/0325587 A1* | 11/2015 | Chen ................ H01L 27/11582 257/314 |
| 2017/0024266 A1 | 1/2017 | Iwai |
| 2021/0224151 A1* | 7/2021 | Lee ...................... G06F 11/076 |
| 2021/0279180 A1* | 9/2021 | Um ......................... G06F 12/10 |
| 2021/0279237 A1* | 9/2021 | Idreos ................ G06F 16/2465 |

FOREIGN PATENT DOCUMENTS

| | | | |
|---|---|---|---|
| JP | 2016076106 A | 5/2016 | |
| KR | 100439781 B1 | 10/2004 | |

\* cited by examiner

NONVOLATILE MEMORY DEVICE

CROSS-REFERENCE TO RELATED APPLICATIONS

This non-provisional patent application is a continuation-in-part application of non-provisional patent application Ser. No. 15/981,443 filed on May 16, 2018, which claims priority under 35 U.S.C. § 119 to Korean Patent Application No. 10-2017-0136042 filed Oct. 19, 2017 in the Korean Intellectual Property Office, the disclosure of which is incorporated herein by reference in its entirety.

BACKGROUND

The present inventive concepts relate to a semiconductor memory, and more particularly to a nonvolatile memory device and an operation method thereof.

Semiconductor memory devices are classified into volatile memory devices such as static random access memory (SRAM), dynamic RAM (DRAM), synchronous DRAM (SDRAM), and the like which lose data stored therein when powered-off, and nonvolatile memory devices such as read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like which retain data when powered-off.

A storage device may be characterized as including a nonvolatile memory device, and a memory controller that controls the nonvolatile memory device. The nonvolatile memory device typically receives a control signal and a data signal from the memory controller. The input signal may be transmitted to the nonvolatile memory device through an interface that connects the nonvolatile memory device and the memory controller. In the case where a failure occurs in an operation of the storage device, debugging may be performed on the storage device. Software code, a memory controller, an interface, and the like that cause the failure may be targeted for debugging.

SUMMARY

Embodiments of the inventive concepts provide a nonvolatile memory device including debugging for an interface between a memory controller and the nonvolatile memory device, and an operation method thereof.

Embodiments of the inventive concepts further provide a nonvolatile memory device including a memory cell region including first metal pads; and a peripheral circuit region. The peripheral circuit region includes second metal pads; a signal storage circuit that stores control signals and a data signal received from external of the nonvolatile memory device; a debugging information generator that generates debugging information based on the stored control signals and the stored data signal; and a debugging information register that outputs the debugging information in response to a debugging information external of the nonvolatile memory device. The peripheral circuit region is vertically connected to the memory cell region by the first metal pads and the second metal pads.

BRIEF DESCRIPTION OF THE FIGURES

The above and other objects and features of the inventive concepts will become apparent in view of the following detailed description as taken with reference to the accompanying drawings.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
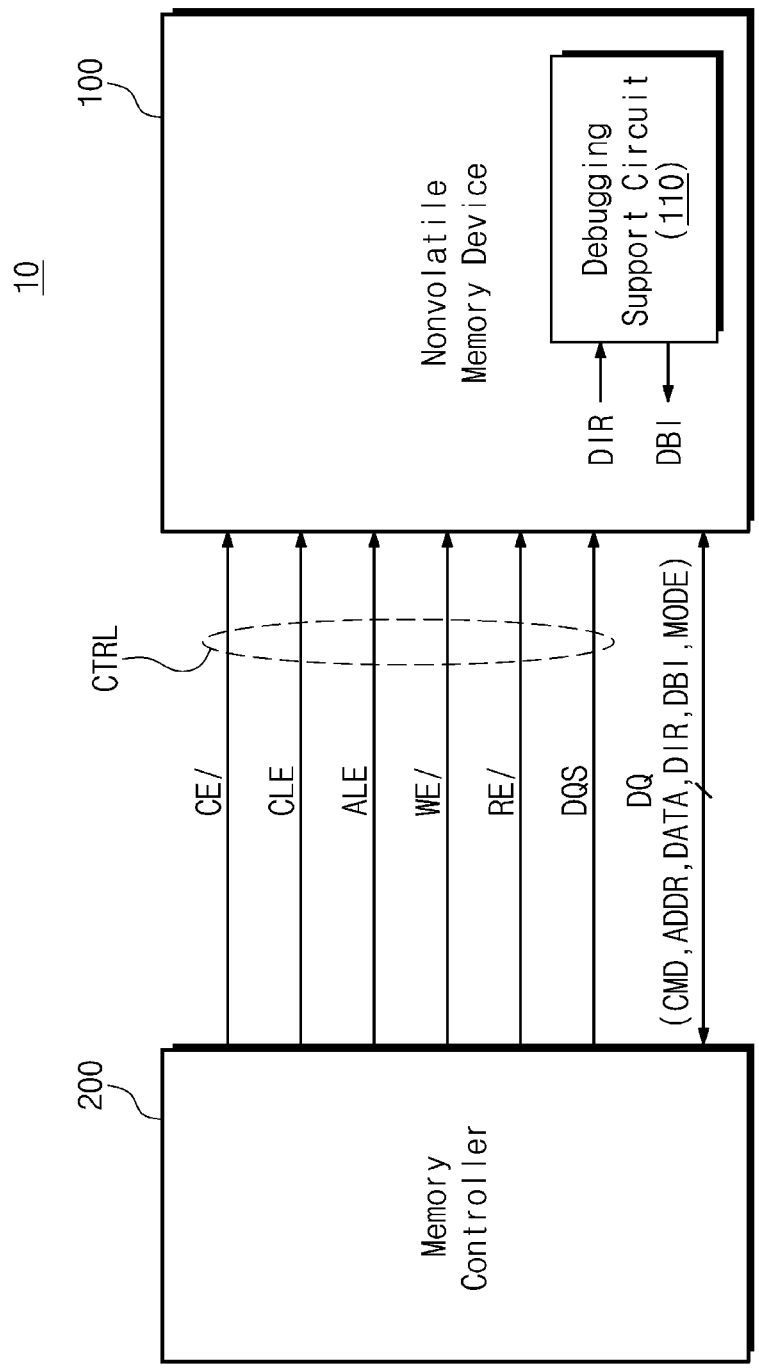
FIG. 1 illustrates a block diagram of a storage device according to an embodiment of the inventive concepts.

FIG. 1 illustrates a block diagram of a storage device according to an embodiment of the inventive concepts. Referring to FIG. 1, a storage device 10 includes a nonvolatile memory device 100 and a memory controller 200.

The memory controller 200 may control an operation of the nonvolatile memory device 100. In an embodiment, the memory controller 200 may provide a control signal CTRL and a data signal DQ to the nonvolatile memory device 100 through different signal lines or different signal pins, to control the nonvolatile memory device 100.

For example, the memory controller 200 may provide the nonvolatile memory device 100 with a chip enable signal CE/, a command latch enable signal CLE, an address latch enable signal ALE, a write enable signal WE/, a read enable signal RE/, a data strobe signal DQS, and a data signal DQ, through different signal pins.

The chip enable signal CE/, the command latch enable signal CLE, the address latch enable signal ALE, the write enable signal WE/, the read enable signal RE/, and the data strobe signal DQS may be included in the control signal CTRL provided from the memory controller 200. The memory controller 200 may provide the control signal CTRL and the data signal DQ to the nonvolatile memory device 100 to direct the nonvolatile memory device 100 to perform various operations.

The memory controller 200 may provide the nonvolatile memory device 100 with a command CMD, an address ADDR, and the data "DATA" through a data pin (DQ pin) to which the data signal DQ is provided. The memory controller 200 may receive the data "DATA" from the nonvolatile memory device 100 through a data pin.

The memory controller 200 may transmit data "DATA" to the nonvolatile memory device 100 to store the data "DATA" in the nonvolatile memory device 100, or may read the data "DATA" from the nonvolatile memory device 100. For example, the memory controller 200 may provide the command CMD, the address ADDR, and the data "DATA" to the nonvolatile memory device 100 such that the data "DATA" are stored in the nonvolatile memory device 100 at an address corresponding to the address ADDR. The memory controller 200 may provide the command CMD and the address ADDR to the nonvolatile memory device 100 to read the data "DATA" from the nonvolatile memory device 100 at an address corresponding to the address ADDR. The memory controller 200 may provide the control signal CTRL as well as the data signal DQ to the nonvolatile memory device 100 for the purpose of storing and reading the data "DATA".

The nonvolatile memory device 100 performs a corresponding operation in response to the control signal CTRL and the data signal DQ provided from the memory controller 200. For example, the nonvolatile memory device 100 may receive the data signal DQ, in which the command CMD and the address ADDR are included, from the memory controller 200 and may provide the data "DATA" to the memory controller 200.

The nonvolatile memory device 100 may determine whether signals provided through the data signal DQ are the command CMD, the address ADDR, or the data "DATA", based on the control signal CTRL. For example, the nonvolatile memory device 100 may determine a type of the data signal DQ, based on the chip enable signal CE/, the command latch enable signal CLE, the address latch enable signal ALE, the write enable signal WE/, the read enable signal RE/, and the data strobe signal DQS.

In an embodiment, the nonvolatile memory device 100 may include NAND flash memory. However, the inventive concepts are not limited to nonvolatile memory device 100 including NAND flash memory. That is, in other embodiments the nonvolatile memory device 100 may include at least one of volatile or nonvolatile memories such as for example SRAM, DRAM, SDRAM, ROM, PROM, EPROM, EEPROM, flash memory, PRAM, MRAM, RRAM, FRAM, and the like.

The nonvolatile memory device 100 according to an embodiment of the inventive concepts includes a debugging support circuit 110. In an embodiment, the debugging support circuit 110 may be implemented in the form of software, hardware, or a combination thereof. The debugging support circuit 110 may store an input signal (e.g., the control signal CTRL and the data signal DQ) provided from the memory controller 200, and may generate debugging information DBI from the stored input signal. Upon receiving a debugging information request DIR from the memory controller 200, the debugging support circuit 110 may provide the debugging information DBI to the memory controller 200.

The memory controller 200 may receive a debugging request for signals provided to the nonvolatile memory device 100 from a host (not illustrated). The memory controller 200 may provide the debugging information request DIR to the nonvolatile memory device 100 through the data signal DQ. The debugging support circuit 110 may provide the stored debugging information DBI to the memory controller 200 through the data signal DQ in response to the debugging information request DIR. The memory controller 200 may receive the debugging information DBI and may provide the received debugging information DBI to the host (not illustrated).

In an embodiment, the memory controller 200 may provide a debugging mode "MODE" to the nonvolatile memory device 100 through the data signal DQ. The debugging support circuit 110 may output only the debugging information DBI of a corresponding mode from among a plurality of modes in response to the debugging mode "MODE". As such, in response to the debugging mode "MODE", the debugging support circuit 110 may provide the host (not illustrated) with only certain debugging information DBI from among various kinds of debugging information DBI which the host (not illustrated) requires.

In the case where power is supplied to the nonvolatile memory device 100 and an operation of the debugging support circuit 110 starts, the debugging support circuit 110 may generate the debugging information DBI and may store the generated debugging information DBI.

In an embodiment, although not illustrated in FIG. 1, the memory controller 200 may provide a debugging enable signal and a debugging disable signal to the nonvolatile memory device 100 through the data signal DQ. In the case where the debugging enable signal is received, the nonvolatile memory device 100 may operate the debugging support circuit 110. The debugging support circuit 110 may generate the debugging information DBI in response to the debugging enable signal. In the case where the debugging disable signal is received, the nonvolatile memory device 100 may stop the operation of the debugging support circuit 110. The debugging support circuit 110 may stop generating the debugging information DBI in response to the debugging disable signal.

In an embodiment, the debugging support circuit 110 may generate the debugging information DBI within a given time or of a given memory capacity. In the case where the debugging support circuit 110 continues to store the debugging information DBI, the capacity of a memory storing the debugging information DBI may be insufficient. Accordingly, the debugging support circuit 110 may store the debugging information DBI generated most recently or may store the debugging information DBI only of a given memory capacity.

As such, the storage device 10 according to an embodiment of the inventive concepts may provide various debugging information DBI to the host (not illustrated) through the debugging support circuit 110. Accordingly, in the case where a failure arises from the storage device 10, the host (not illustrated) may check whether an interface between the memory controller 200 and the nonvolatile memory device 100 causes the failure.

As described above, the debugging information request DIR and the debugging information DBI may be provided through the data signal DQ. However, the inventive concepts are not limited to providing the debugging information request DIR and the debugging information DBI through the data signal DQ. For example, the debugging information request DIR and the debugging information DBI may be provided through a separate pin. Also, the control signal CTRL and the data signal DQ illustrated in FIG. 1 are only one exemplification of the inventive concepts, and the inventive concepts are not limited as here described. For example, the inventive concepts may provide the host (not illustrated) with the debugging information DBI associated with various kinds of control signals and data signals as well as the control signal CTRL and the data signal DQ illustrated in FIG. 1.

Below, for convenience of description, an operation of the debugging support circuit 110 will be described on the basis of the control signal CTRL and the data signal DQ illustrated in FIG. 1.

Figure 2:
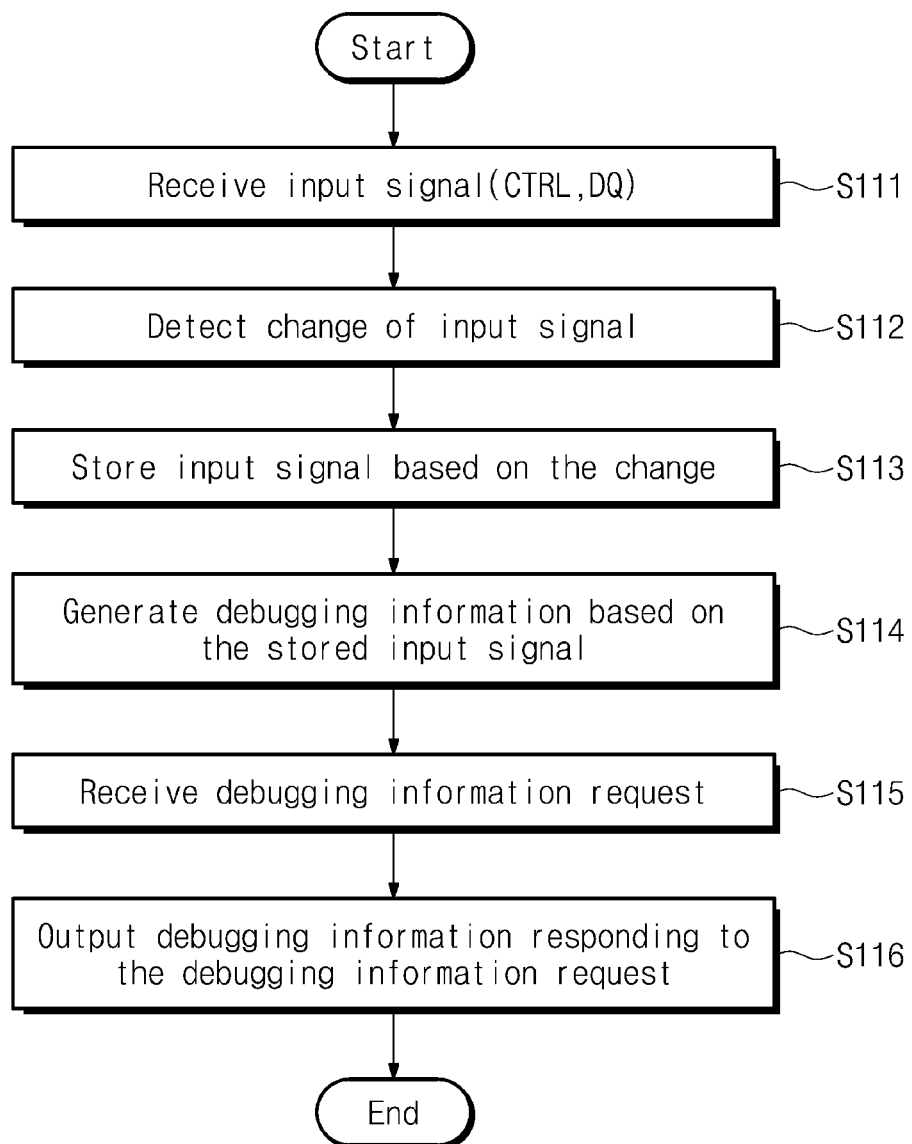
FIG. 2 illustrates a flowchart of a debugging information providing operation of a nonvolatile memory device of FIG. 1.

FIG. 2 illustrates a flowchart of a debugging information providing operation of a nonvolatile memory device of FIG. 1. Referring to FIGS. 1 and 2, in operation S111, the nonvolatile memory device 100 receives an input signal from the memory controller 200. The input signal may include the control signal CTRL and the data signal DQ.

In operation S112, the nonvolatile memory device 100 detects the input signal. In an embodiment, the nonvolatile memory device 100 may detect a change or a level of the control signal CTRL thus provided.

In operation S113, the nonvolatile memory device 100 stores the input signal based on the detection result. In an embodiment, the nonvolatile memory device 100 may store input signals provided through different pins, respectively. The nonvolatile memory device 100 may detect a change of the control signal CTRL, and may store the control signal CTRL and the data signal DQ at a time when the change is detected. The nonvolatile memory device 100 may detect a change and a magnitude of the control signal CTRL to determine and store the data signal DQ as the command CMD, the address ADDR, or the data "DATA".

In operation S114, the nonvolatile memory device 100 generates the debugging information DBI based on the stored input signal. In an embodiment, the nonvolatile memory device 100 may decode the input signal to check what a value of the input signal indicates. The nonvolatile memory device 100 may determine the validity of the input signal to generate the debugging information DBI.

In operation S115, the nonvolatile memory device 100 receives the debugging information request DIR from the memory controller 200. For example, the nonvolatile memory device 100 may receive the debugging information request DIR through the data signal DQ.

In operation S116, the nonvolatile memory device 100 outputs the debugging information DBI in response to the debugging information request DIR. The debugging information DBI output in operation S116 may include the input signal stored in operation S113 or the debugging information DBI generated in operation S114. The nonvolatile memory device 100 may provide the debugging information DBI to the memory controller 200 through the data signal DQ.

As described above, the nonvolatile memory device 100 of the inventive concepts may perform operation S111 to operation S116 to output the debugging information DBI. In detail, operation S111 to operation S116 may be performed through the debugging support circuit 110 of the nonvolatile memory device 100.

Figure 3:
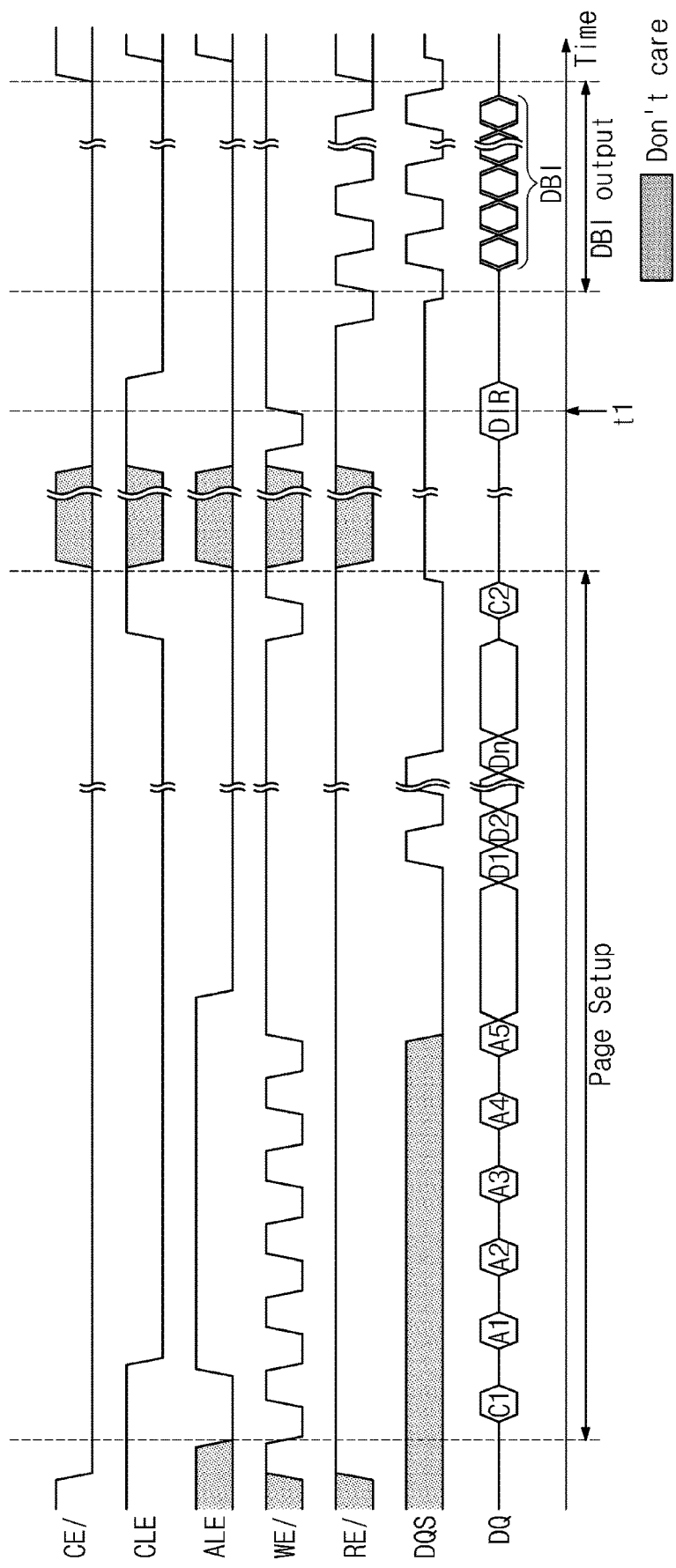
FIG. 3 illustrates a timing diagram of a debugging information providing operation of the nonvolatile memory device of FIG. 1.

FIG. 3 illustrates a timing diagram of a debugging information providing operation of a nonvolatile memory device of FIG. 1. For a brief description and for brevity of illustration, a program sequence will be described with reference to signals provided to the nonvolatile memory device 100 of FIG. 1. However, in other embodiments the debugging information providing operation may be performed with respect to a reading operation or other operation. For brevity of illustration, the respective signals are schematically illustrated, but the inventive concepts are not limited thereto.

Referring to FIGS. 1 and 3, the memory controller 200 transmits the control signal CTRL and the data signal DQ for a page program operation to the nonvolatile memory device 100. During a page setup period, the memory controller 200 may provide the command CMD, the address ADDR, and the data "DATA" to the nonvolatile memory device 100 through the data signal DQ. The memory controller 200 may sequentially provide a first command C1, first to fifth addresses A1 to A5, first to n-th data D1 to Dn, and a second command C2. In an embodiment, the first command C1 may be a data input command (e.g., 80h) for a page program operation, and the second command C2 may be a confirm command (e.g., 10h) for the page program operation. The first to fifth addresses A1 to A5 may be an address of a memory area of the nonvolatile memory device 100, in which the first to n-th data D1 to Dn will be programmed. The first to fifth addresses A1 to A5 may include a column address and a row address.

During the page setup period, the chip enable signal CE/is at a low level. First, when the command latch enable signal CLE is at a high level, the first command C1 is provided at a rising edge of the write enable signal WE/. Then, when the address latch enable signal ALE is at a high level, the first to fifth addresses A1 to A5 are respectively provided at rising edges of the write enable signal WE/. Afterwards, the first to n-th data signals D1 to Dn are provided at rising edges and falling edges of the data strobe signal DQS. The command latch enable signal CLE may thereafter transition to a high level, and the second command C2 is provided at a rising edge of the write enable signal WE/.

The debugging support circuit 110 of the nonvolatile memory device 100 may store the control signal CTRL and the data signal DQ provided during the page setup period. For example, during the page setup period, the debugging support circuit 110 may detect a rising edge of the write enable signal WE/ to store the control signal CTRL and the data signal DQ.

To request the debugging information DBI, the memory controller 200 may provide the debugging information request DIR to the nonvolatile memory device 100 at a first time t1. The memory controller 200 may provide the debugging information request DIR through the data signal DQ. In an embodiment, the debugging information request DIR may be a read command, a combination of specific commands, a vendor specific command, or a combination thereof.

After receiving the debugging information request DIR, the nonvolatile memory device 100 may provide the stored debugging information DBI to the memory controller 200. For example, in an output period of the debugging information DBI, the read enable signal RE/ may transition to a high level and a low level repeatedly (toggling). The data strobe signal DQS may transition to a high level and a low level repeatedly, with a given time interval existing between the data strobe signal DQS and the read enable signal RE/. The nonvolatile memory device 100 may sequentially output the debugging information DBI based on rising edges and falling edges of the data strobe signal DQS.

During a debugging information output period, the debugging support circuit 110 may provide the stored control signal CTRL and the stored data signal DQ as the debugging information DBI. Also, the debugging support circuit 110 may provide various debugging information DBI generated from the stored control signal CTRL and the stored data signal DQ. The debugging information DBI that the debugging support circuit 110 provides will be more fully described later.

As illustrated in FIG. 3, an operation of providing the debugging information DBI on the basis of an exemplification in which the control signal CTRL and the data signal DQ for the page program operation are input. However, the inventive concepts are not limited thereto. For example, even though various control and data signals for performing various operations are input, the nonvolatile memory device 100 may perform an operation similar to the above-described operation to provide the debugging information DBI.

Hereinafter, an operation of the debugging support circuit 110 will be more fully described. For convenience of description, an operation of the debugging support circuit 110 will be described on the basis of an embodiment in which the debugging support circuit 110 operates in response to the debugging mode "MODE". However, the inventive concepts are not limited to the following description.

Figures 4, 5:
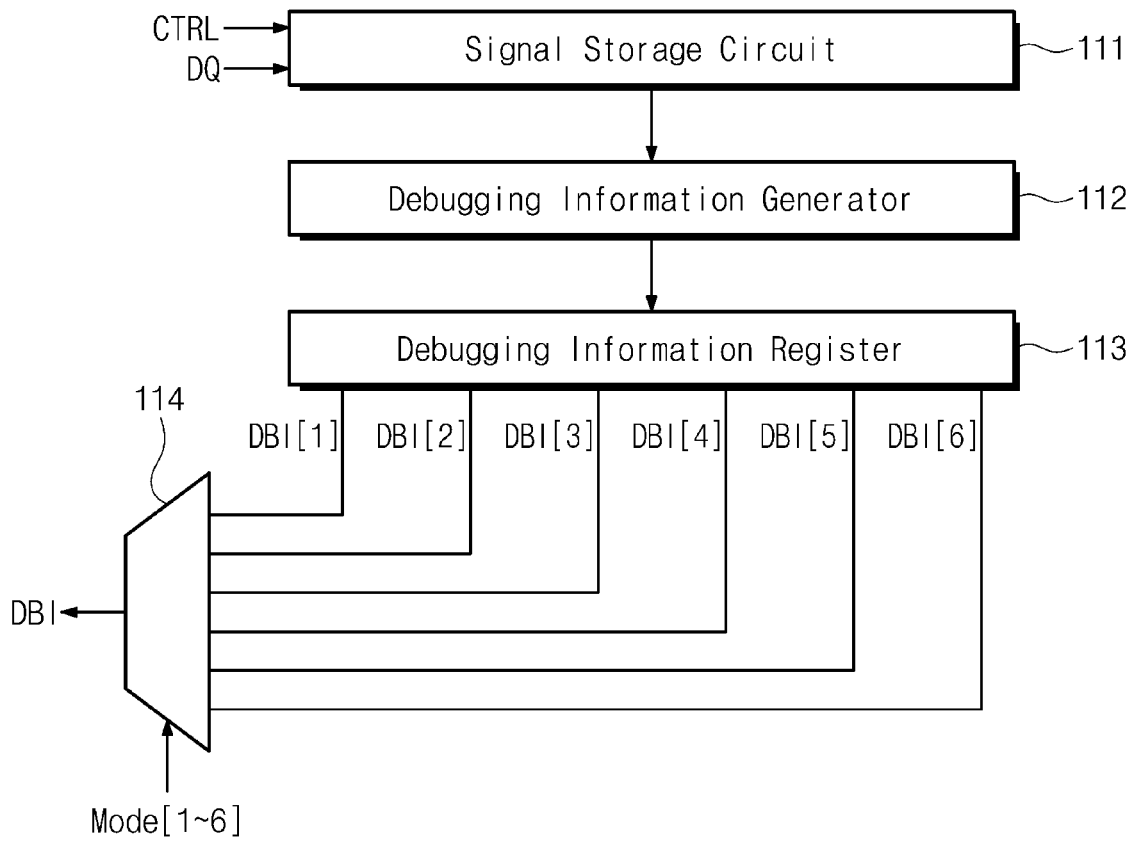
FIG. 4 illustrates a view of a debugging support circuit according to an embodiment of the inventive concepts.
FIG. 5 illustrates a view of debugging information that the debugging support circuit of FIG. 4 provides.

FIG. 4 illustrates a view of a debugging support circuit according to an embodiment of the inventive concepts. Referring to FIGS. 1 and 4, the debugging support circuit 110 includes a signal storage circuit 111, a debugging information generator 112, a debugging information register 113, and an output circuit 114.

The signal storage circuit 111 detects an input signal provided to the nonvolatile memory device 100. In an embodiment, the signal storage circuit 111 may detect a change and a magnitude of the control signal CTRL. For example, the signal storage circuit 111 may detect a rising edge, a falling edge, a high level, a low level, or the like of the control signal CTRL.

The signal storage circuit 111 stores the input signal based on the detection result. In an embodiment, the signal storage circuit 111 may store a level of the control signal CTRL or a level of the data signal DQ. The signal storage circuit 111 may determine and store signals input through different pins. For example, the signal storage circuit 111 may determine and store the command CMD, the address ADDR, or the data "DATA" as the data signal DQ. The signal storage circuit 111 may store the input signal based on a time or a memory capacity.

The signal storage circuit 111 may store the input signal by using at least one of e-fuses, flip-flops, or latches of a page buffer (not illustrated).

The debugging information generator 112 decodes signals stored in the signal storage circuit 111 to generate various kinds of debugging information DBI. The debugging information generator 112 may determine whether each of the stored control signal CTRL and the stored data signal DQ has a valid value and may generate various kinds of debugging information DBI based on the determination result, that is, the validity.

In an embodiment, the debugging information generator 112 may determine the validity of the data signal DQ on the basis of a permissible value or a range that the data signal DQ may be depending on a type of the data signal DQ. The value or range that the data signal DQ is able to have may be set in advance according to the specifications of a chip or a circuit.

The debugging information register 113 stores the debugging information DBI and may output the stored debugging information DBI in response to the debugging information request DIR. The debugging information register 113 may store information stored in the signal storage circuit 111 as well as the debugging information DBI generated in the debugging information generator 112, as the debugging information DBI. The debugging information register 113 may store an input signal based on a time or a memory capacity.

The output circuit 114 outputs the debugging information DBI generated in the debugging support circuit 110. The output circuit 114 may output all the debugging information DBI stored in the debugging support circuit 110 in response to the debugging information request DIR. Alternatively, as illustrated in FIG. 4, the output circuit 114 may output the debugging information DBI, which corresponds to the debugging mode "MODE", from among a plurality of debugging information DBI. The output circuit 114 may include a multiplexer.

For example, in the case where first to sixth debugging modes MODE[1] to MODE[6] are received, the output circuit 114 may output first to sixth debugging information DBI[1] to DBI[6] respectively corresponding to the first to sixth debugging modes MODE[1] to MODE[6].

FIG. 5 illustrates a view of debugging information that a debugging support circuit of FIG. 4 provides. In detail, the debugging support circuit 110 may provide the first to sixth debugging information DBI[1] to DBI[6]. Referring to FIGS. 4 and 5, the debugging support circuit 110 may provide an accumulated data signal DQ as the first debugging information DBI[1].

In an embodiment, the signal storage circuit 111 may detect changes of the control signal CTRL and may store the data signal DQ based on the detected result. The debugging information register 113 may accumulate and store the data signal DQ stored in the signal storage circuit 111. The accumulated data signal may include the command CMD, the address ADDR, and the data "DATA". The debugging information register 113 may output the accumulated data signal as the first debugging information DBI[1]. A host (not illustrated) may check the data signal DQ input to the nonvolatile memory device 100 from the accumulated data signal. For example, the host may compare the data signal DQ input to the nonvolatile memory device 100 with the accumulated data signal.

The debugging support circuit 110 may provide information about a type of the data signal DQ as the second debugging information DBI[2]. In an embodiment, the signal storage circuit 111 may determine a type of the data signal DQ and may store the data signal DQ by using flags. The signal storage circuit 111 may determine a type of the data signal DQ as the command CMD, the address ADDR, or the data "DATA" and may store the command CMD, the address ADDR, and the data "DATA" by using different flags. For example, in the case that an input data signal DQ is the command CMD, the signal storage circuit 111 may store a flag value of "1". In the case that the input data signal DQ is the address ADDR, the signal storage circuit 111 may store a flag value of "0". In an embodiment, a type of the data signal DQ may be determined based on a level of the control signal CTRL at a time when the data signal DQ is received.

The debugging information register 113 may accumulate and store data signal flags stored in the signal storage circuit 111. The debugging information register 113 may provide the accumulated data signal flag as the second debugging information DBI[2]. The host (not illustrated) may check a type of the data signal DQ input to the nonvolatile memory device 100 from the data signal flag.

The debugging support circuit 110 may provide information about the validity of the command/address as the third debugging information DBI[3]. In an embodiment, the debugging information generator 112 may decode the data signal DQ to determine whether a value indicated by the command CMD is valid. Also, the debugging information generator 112 may decode the data signal DQ to determine whether a value indicated by the address ADDR is valid. The debugging information generator 112 may generate flags based on the validity of the command/address associated with the data signal DQ indicating one operation command.

The debugging information register 113 may store the generated command/address validity flags and may provide the stored command/address validity flags as the third debugging information DBI[3]. The host (not illustrated) may determine whether the command CMD and the address ADDR input to the nonvolatile memory device 100 are valid, from the command/address validity flags.

The debugging support circuit 110 may provide the number of valid commands and addresses as the fourth debugging information DBI[4]. In an embodiment, the debugging information generator 112 may determine whether a value indicated by each of the command CMD and the address ADDR is valid and may calculate how many commands CMD and addresses ADDR are valid (i.e., a sum of the number of valid commands and the number of valid addresses).

The debugging information register 113 may store the number of valid commands and addresses thus calculated. The debugging information register 113 may provide the number of valid commands and addresses thus stored as the fourth debugging information DBI[4]. The host (not illustrated) may check the number of valid commands and addresses input to the nonvolatile memory device 100 from the number of valid commands and addresses.

The debugging support circuit 110 may provide the number of operations (meaning how many times the operation is performed) as the fifth debugging information DBI[5]. The number of operations indicates the number of operations performed in the nonvolatile memory device 100 in response to an input signal provided to the nonvolatile memory device 100. In an embodiment, the debugging information generator 112 may decode the command CMD to determine one operation command, and may calculate the number of operations if all the commands CMD of the data signal DQ indicating one operation command are valid. The debugging information generator 112 may determine a type of an operation (e.g., a page program operation, a data read operation, and the like) performed in the nonvolatile memory device 100, to calculate the number of operations.

The debugging information register 113 may store the number of operations thus calculated and may provide the number of operations thus stored as the fifth debugging information DBI[5]. The host (not illustrated) may check the number of operations performed in the nonvolatile memory device 100 from the number of operations provided as the fifth debugging information DBI[5].

The debugging support circuit 110 may provide the validity of combinations of input signals as the sixth debugging information DBI[6]. In an embodiment, the debugging information generator 112 may determine whether combinations of values indicated by input signals provided through different pins at specific times are valid. For example, the debugging information generator 112 may determine whether combinations of input signals input at clock activation times (e.g., rising edges of the write enable signal WE/) are valid. The debugging information generator 112 may generate flags based on the validity.

The debugging information register 113 may store the validity of the combinations of the input signals thus generated and provide input signal combination flags as the sixth debugging information DBI[6]. The host (not illustrated) may check a state of input signals input to the nonvolatile memory device 100 at specific times from the input signal combination flags. For example, the host may check if a state of input signals input to the nonvolatile memory device 100 at a specific time from among a plurality of specific times is valid based on a corresponding input signal combination flag from among the input signal combination flags.

As described above, the host (not illustrated) may determine whether a problem arises from an interface between the nonvolatile memory device 100 and the memory controller 200, based on the various debugging information DBI provided from the nonvolatile memory device 100.

As described above, the debugging support circuit 110 according to an embodiment of the inventive concepts may generate and store various kinds of debugging information DBI. The debugging support circuit 110 may output the debugging information DBI depending on the debugging information request DIR. The debugging information DBI output from the debugging support circuit 110 is not limited to the debugging information DBI illustrated in FIG. 5, and all debugging information DBI that is able to be generated from an input signal may be included.

Figure 6:
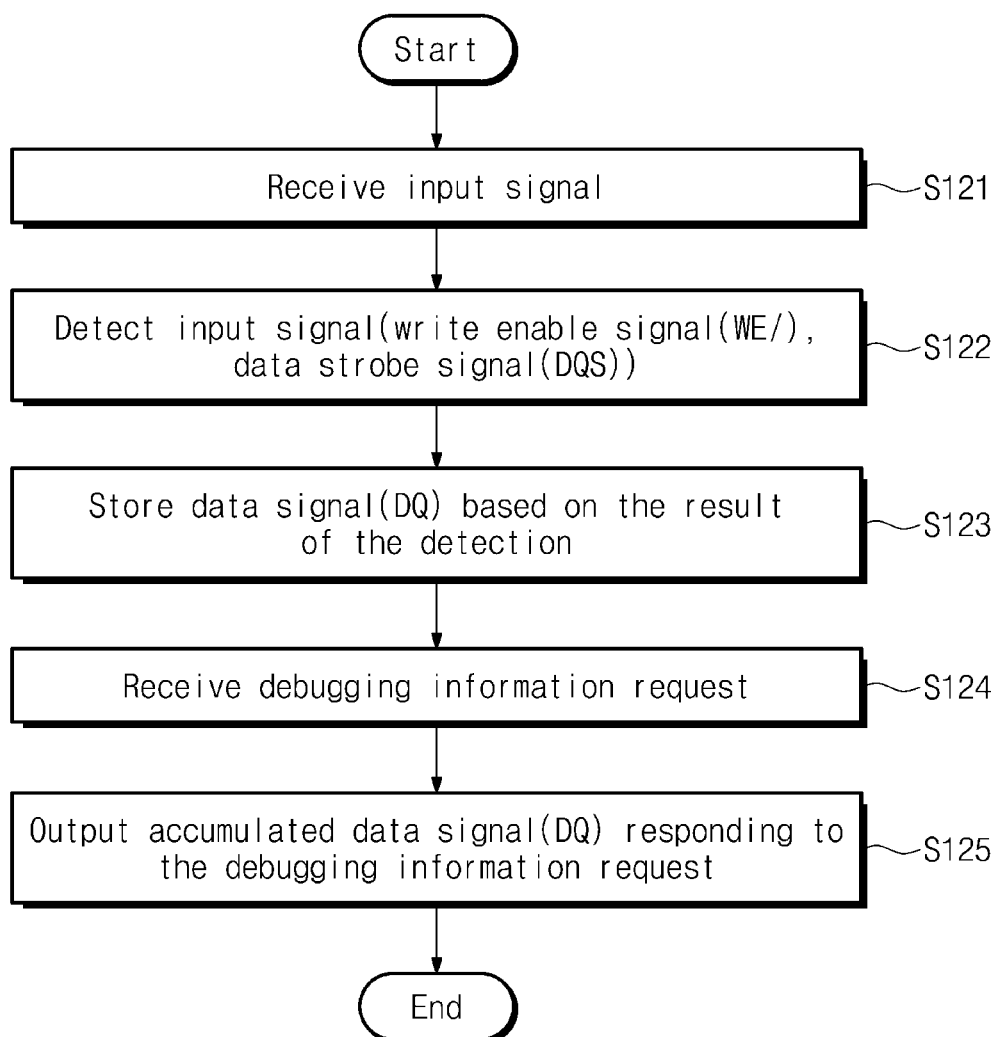
FIG. 6 illustrates a flowchart of an operation method in which the debugging support circuit of FIG. 4 provides first debugging information.

FIG. 6 illustrates a flowchart of an operation method in which a debugging support circuit of FIG. 4 provides first debugging information. Referring to FIGS. 4 and 6, in operation S121, the debugging support circuit 110 receives an input signal. For example, the input signal may be the control signal CTRL and/or the data signal DQ. In operation S122, the debugging support circuit 110 detects the input signal. In an embodiment, the debugging support circuit 110 may detect rising edges of the write enable signal WE/, or rising edges or falling edges of the data strobe signal DQS.

In operation S123, the debugging support circuit 110 stores the data signal DQ based on the detection result. In operation S124, the debugging support circuit 110 receives the debugging information request DIR. In operation S125, the debugging support circuit 110 outputs an accumulated data signal as the first debugging information DB [1] in response to the debugging information request DIR.

Figure 7:
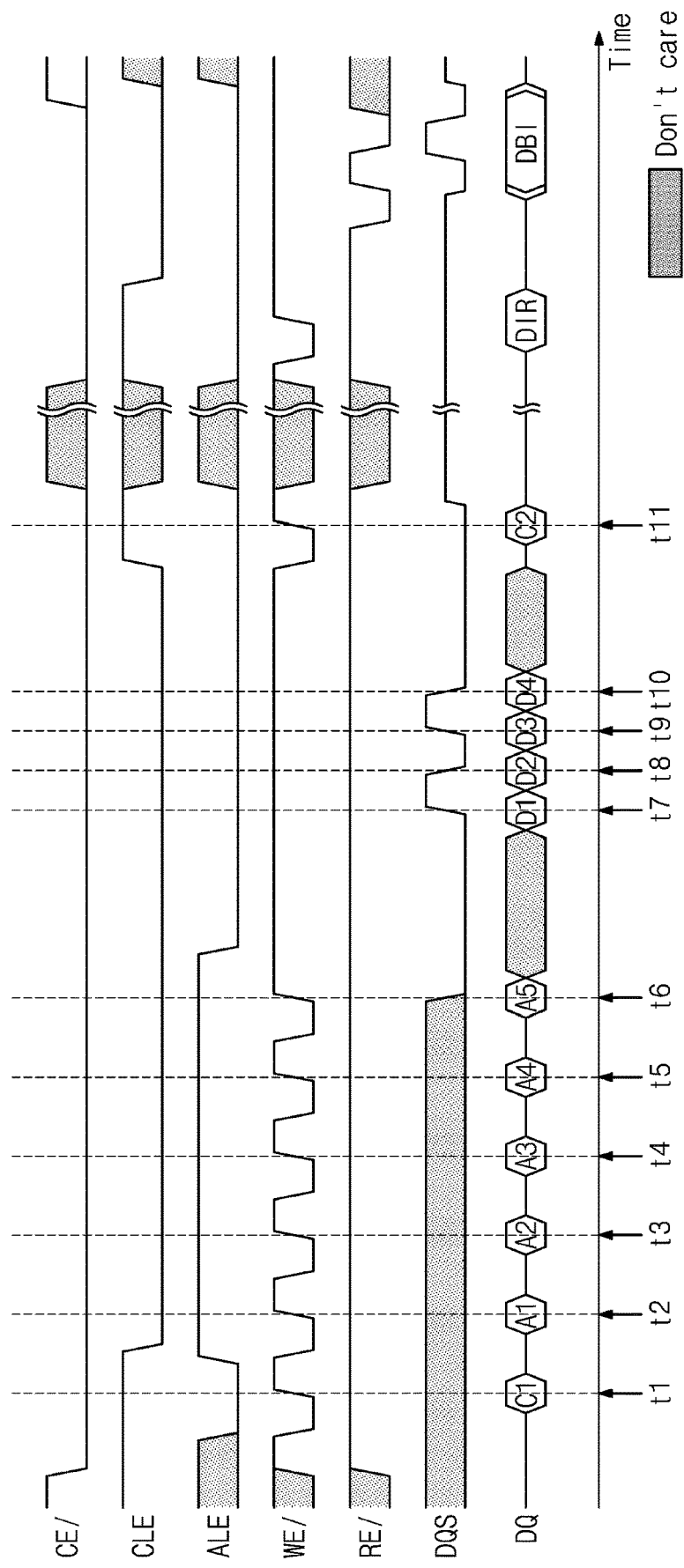
FIG. 7 illustrates a timing diagram of an operation of providing first debugging information.

FIG. 7 illustrates a timing diagram of an operation of providing first debugging information. Referring to FIGS. 4 and 7, in the case where the signal storage circuit 111 detects the rising edges of the write enable signal WE/, and the rising or falling edges of the data strobe signal DQS (e.g., at a first time t1 to an eleventh time t11), the signal storage circuit 111 may store a signal provided through the data signal DQ. The signal storage circuit 111 may store the data signals DQ corresponding to the first time t1 to the eleventh time t11. For example, the data signals DQ provided at the first time t1 to the eleventh time t11 may be "C1", "A1", "A2", "A3", "A4", "A5", "D1", "D2", "D3", "D4", and "C2".

The debugging information register 113 may accumulate and store the data signal DQ stored in the signal storage circuit 111. In the case where the debugging support circuit 110 receives the debugging information request DIR, the debugging information register 113 may output the stored data signal DQ as the debugging information DBI. The debugging information register 113 may output values of the following table 1 as the first debugging information DBI[1].

TABLE 1

| MODE | Debugging Information(DBI) Output |
|---|---|
| MODE[1] | [C1], [A1], [A2], [A3], [A4], [A5], [D1], [D2], [D3], [D4], [C2] |

Figure 8:
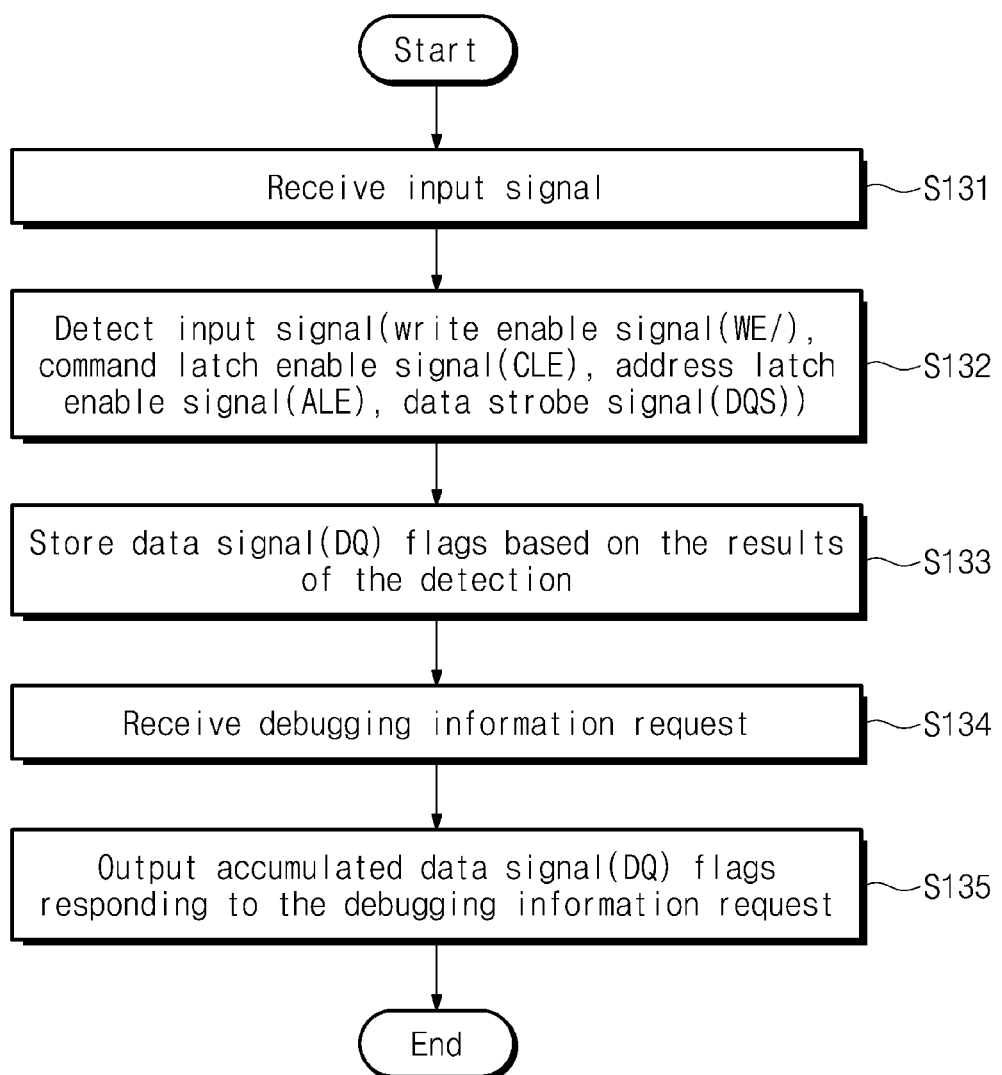
FIG. 8 illustrates a flowchart of an operation method in which the debugging support circuit of FIG. 4 provides second debugging information.

FIG. 8 illustrates a flowchart of an operation method in which a debugging support circuit of FIG. 4 provides second debugging information. Referring to FIGS. 4 and 8, in operation S131, the debugging support circuit 110 receives an input signal. In operation S132, the debugging support circuit 110 detects the input signal. In an embodiment, the debugging support circuit 110 may detect rising edges of the write enable signal WE/, a high level of the command latch enable signal CLE, a high level of the address latch enable signal ALE, and rising edges or falling edges of the data strobe signal DQS.

In operation S133, the debugging support circuit 110 stores flags of the data signal DQ based on the detection result. In operation S134, the debugging support circuit 110 receives the debugging information request DIR. In operation S135, the debugging support circuit 110 outputs accumulated data signal flags as the second debugging information DB[2] in response to the debugging information request DIR.

Figure 9:
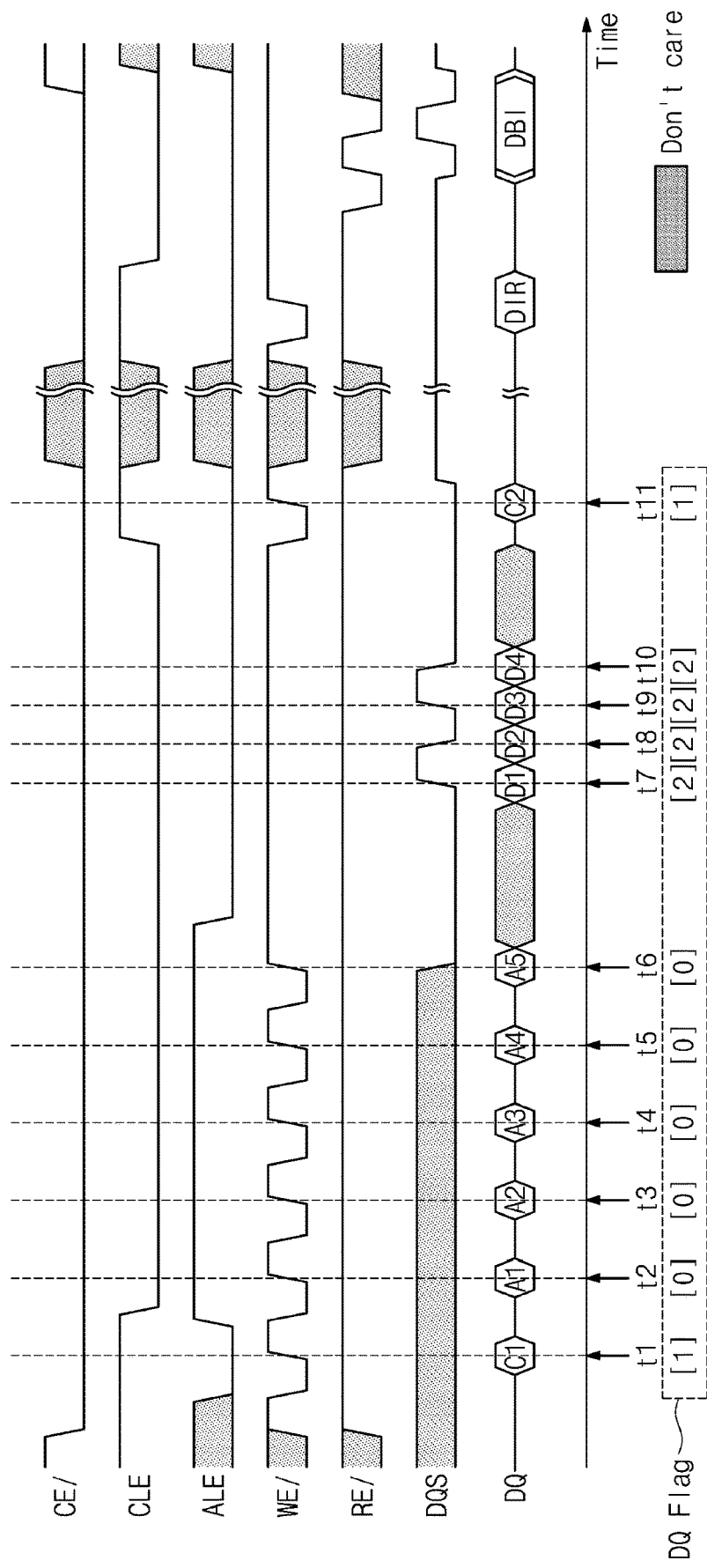
FIG. 9 illustrates a timing diagram of an operation of providing second debugging information.

FIG. 9 illustrates a timing diagram of an operation of providing second debugging information. Referring to FIGS. 4 and 9, in the case where the signal storage circuit 111 detects a high level of the command latch enable signal CLE and rising edges of the write enable signal WE/ (e.g., at a first time t1 and an eleventh time t11), the signal storage circuit 111 may determine and store a signal provided through the data signal DQ as the command CMD. For example, the signal storage circuit 111 may store a value indicating the command CMD by using a data signal flag (e.g., "1").

In the case where the signal storage circuit 111 detects a high level of the address latch enable signal ALE and rising edges of the write enable signal WE/ (e.g., at a second time t2 to a sixth time t6), the signal storage circuit 111 may determine and store a signal provided through the data signal DQ as the address ADDR. For example, the signal storage circuit 111 may store a value indicating the address ADDR by using a data signal flag (e.g., "0").

In the case where the signal storage circuit 111 detects rising edges or falling edges of the data strobe signal DQS (e.g., at a seventh time t7 to a tenth time t10), the signal storage circuit 111 may determine and store a signal provided through the data signal DQ as the data "DATA". For example, the signal storage circuit 111 may store a value indicating the data "DATA" by using a data signal flag (e.g., "2").

The debugging information register 113 may accumulate and store data signal flags stored in the signal storage circuit 111. In the case where the debugging support circuit 110 receives the debugging information request DIR, the debugging information register 113 may output the stored data signal flags as the debugging information DBI. The debugging information register 113 may output values of the following table 2 as the second debugging information DBI[2].

TABLE 2

| MODE | Debugging Information(DBI) Output |
|---|---|
| MODE[2] | [1], [0], [0], [0], [0], [0], [2], [2], [2], [2], [1] |

Figure 10:
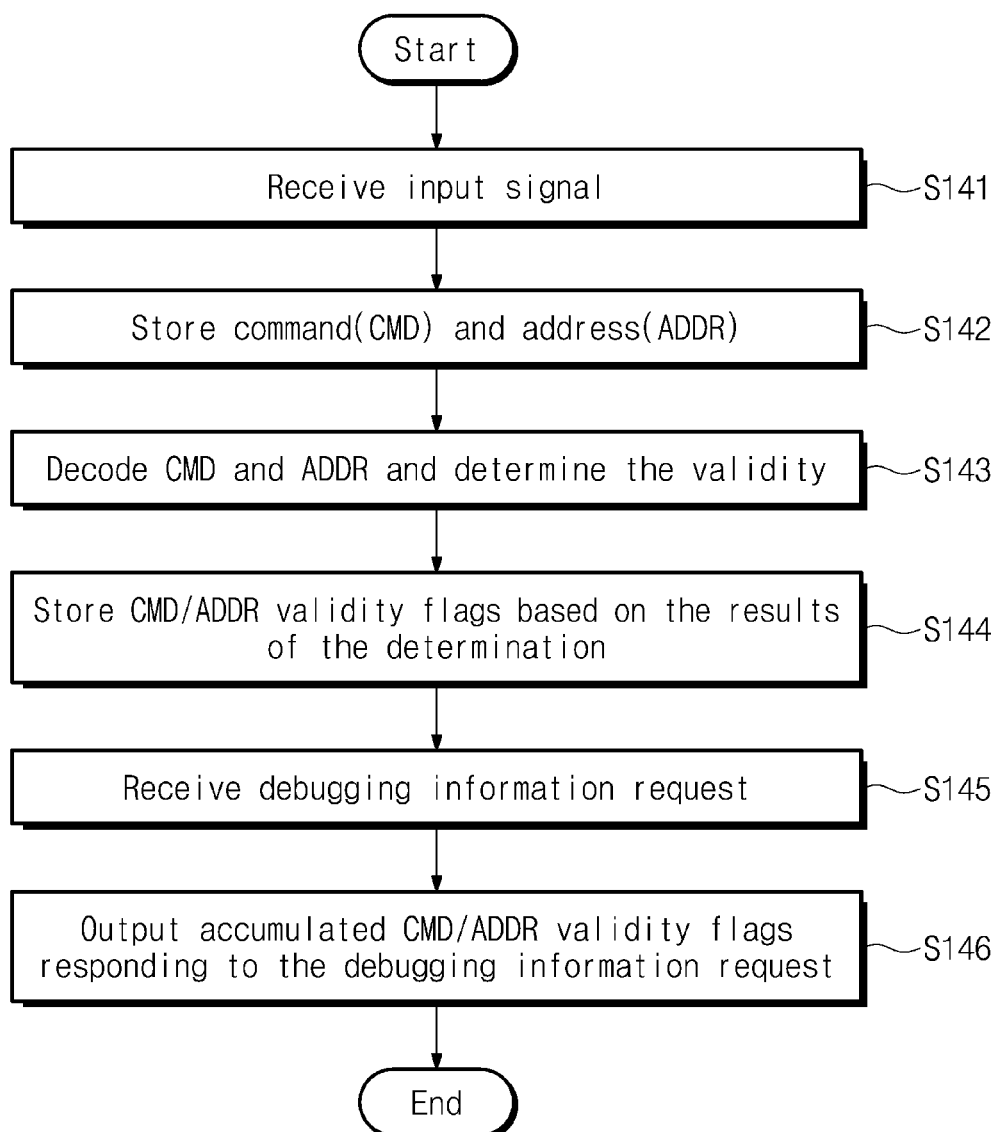
FIG. 10 illustrates a flowchart of an operation method in which the debugging support circuit of FIG. 4 provides third debugging information.

FIG. 10 illustrates a flowchart of an operation method in which a debugging support circuit of FIG. 4 provides third debugging information. Referring to FIGS. 4 and 10, in operation S141, the debugging support circuit 110 receives an input signal. In operation S142, the debugging support circuit 110 stores the command CMD and the address ADDR. In operation S143, the debugging support circuit 110 decodes the command CMD and the address ADDR to determine the validity. The debugging support circuit 110 may determine the validity of the command CMD on the basis of a preset value of the command CMD. Also, the debugging support circuit 110 may determine the validity of the address ADDR on the basis of a preset range of the address ADDR.

In operation S144, the debugging support circuit 110 stores command/address validity flags based on the determination results. In an embodiment, the debugging support circuit 110 may determine whether all the data signals DQ of each operation unit are valid, and may store the command/address validity flags as the determination result.

In operation S145, the debugging support circuit 110 receives the debugging information request DIR. In operation S146, the debugging support circuit 110 outputs accumulated command/address validity flags as the third debugging information DB[3] in response to the debugging information request DIR.

Figure 11:
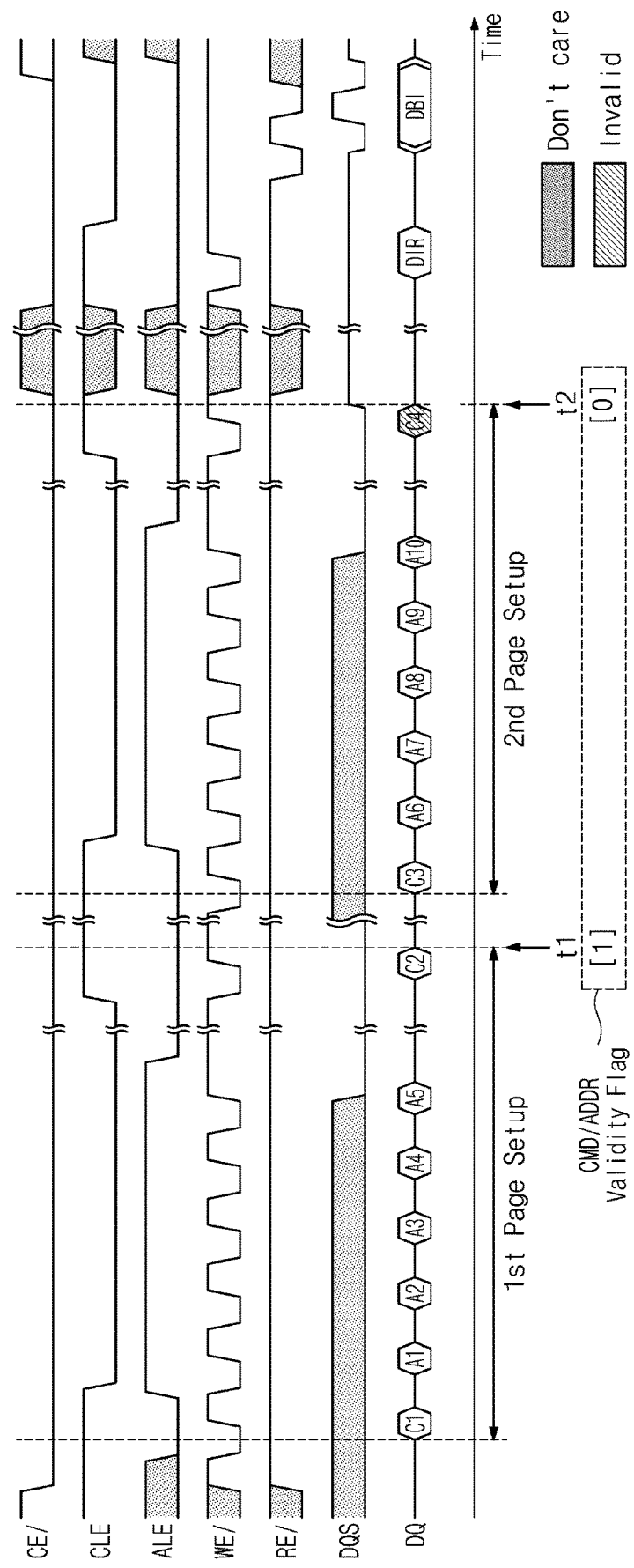
FIG. 11 illustrates a timing diagram of an operation of providing third debugging information.

FIG. 11 illustrates a timing diagram of an operation of providing third debugging information. Referring to FIGS. 4 and 11, during a first page setup period (an operation unit) and a second page setup period (another operation unit), the debugging support circuit 110 may receive the control signal CTRL and the data signal DQ. For convenience of description, data "DATA" provided through the data signal DQ are omitted in FIG. 11.

During the first page setup period and the second page setup period, the signal storage circuit 111 may detect rising edges of the write enable signal WE/, a high level of the command latch enable signal CLE, and a high level of the address latch enable signal ALE. The signal storage circuit 111 may store the data signal DQ input during the first page setup period and the second page setup period based on the detection result.

The debugging information generator 112 may decode the data signal DQ stored in the first page setup period. The debugging information generator 112 may compare the stored first and second commands C1 and C2 (e.g., "80h" and "10h") with preset values. In an embodiment, the debugging information generator 112 may determine the first command C1 as a data input command and the second command C2 as a confirm command, and may compare values of the first and second commands C1 and C2 with the preset values. For example, the debugging information generator 112 may determine that a preset data input command value (e.g., "80h") corresponding to page setup is matched with a value that the first command C1 indicates, and may determine that a confirm command value (e.g., "10h") is matched with a value that the second command C2 indicates. As such, the debugging information generator 112 may determine that the commands C1 and C2 of the data signal DQ input during the first page setup period are valid.

The debugging information generator 112 may compare the first to fifth addresses A1 to A5 (e.g., "01" to "05") stored during the first page setup period with a preset range. The debugging information generator 112 may determine that the first to fifth addresses "01" to "05" are within the preset range, from an address range (e.g., "01" to "99") of a memory area in which preset data will be stored. As such, the debugging information generator 112 may determine that the address ADDR of the data signal DQ input during the first page setup period is valid.

Since both the command CMD and the address ADDR of the data signal DQ input during the first page setup period (operation unit) are valid, the debugging information generator 112 may store a command/address validity flag of "1" at the first time t1.

The debugging information generator 112 may decode the data signal DQ stored in the second page setup period. The debugging information generator 112 may determine that a stored third command C3 (e.g., "80h") is matched with a preset data input command value (e.g., "80h") corresponding to page setup. The debugging information generator 112 may determine that a stored fourth command C4 (e.g., "11h") is not matched with a preset confirm command value (e.g., "10h") corresponding to page setup. As such, the debugging information generator 112 may determine that the command CMD of the data signal DQ input during the second page setup period is invalid.

The debugging information generator 112 may determine that sixth to tenth addresses A6 to A10 stored during the second setup period are valid. Even though the sixth to tenth addresses A6 to A10 stored during the second setup period are valid, since the fourth command C4 of the third and fourth commands C3 and C4 is invalid, the debugging information generator 112 may store a command/address validity flag of "0" at the second time t2.

The debugging information register 113 may accumulate and store the command/address validity flags. In the case where the debugging support circuit 110 receives the debugging information request DIR, the debugging information register 113 may output the accumulated command/address validity flags as the debugging information DBI. The debugging information register 113 may output values of the following table 3 as the third debugging information DBI[3].

TABLE 3

| MODE | Debugging Information(DBI) Output |
|---|---|
| MODE[3] | [1], [0] |

Figure 12:
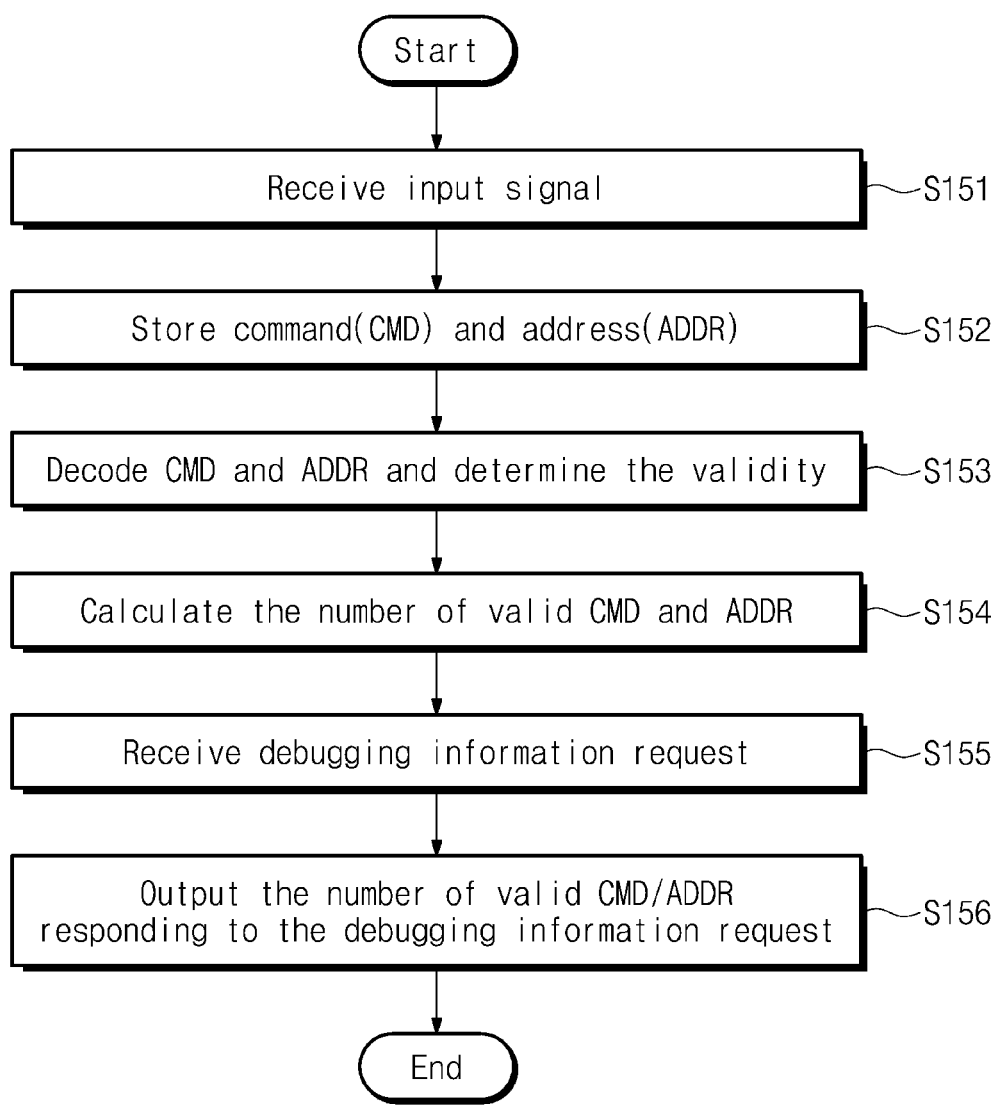
FIG. 12 illustrates a flowchart of an operation method in which the debugging support circuit of FIG. 4 provides fourth debugging information.

FIG. 12 illustrates a flowchart of an operation method in which a debugging support circuit of FIG. 4 provides fourth debugging information. Referring to FIGS. 4 and 12, in operation S151, the debugging support circuit 110 receives an input signal. In operation S152, the debugging support circuit 110 stores the command CMD and the address ADDR. In operation S153, the debugging support circuit 110 decodes the command CMD and the address ADDR to determine validities. The debugging support circuit 110 may determine the validities of the command CMD and the address ADDR on the basis of a preset value of the command CMD and a preset range of the address ADDR.

In operation S154, the debugging support circuit 110 calculates or counts the number of valid commands and addresses based on the determination result. In an embodiment, the debugging support circuit 110 may determine the validity of each signal (e.g., a command signal or an address signal) included in the data signal DQ of one operation unit (i.e., a page setup period), and may calculate the number of valid commands and addresses (i.e., a sum of the number of valid commands and the number of valid addresses) based on the determination result. The debugging information register 110 may accumulate and store the number of valid commands and addresses thus calculated.

In operation S155, the debugging support circuit 110 receives the debugging information request DIR. In operation S156, the debugging support circuit 110 outputs the number of valid commands and addresses as the fourth debugging information DB[4] in response to the debugging information request DIR.

Figure 13:
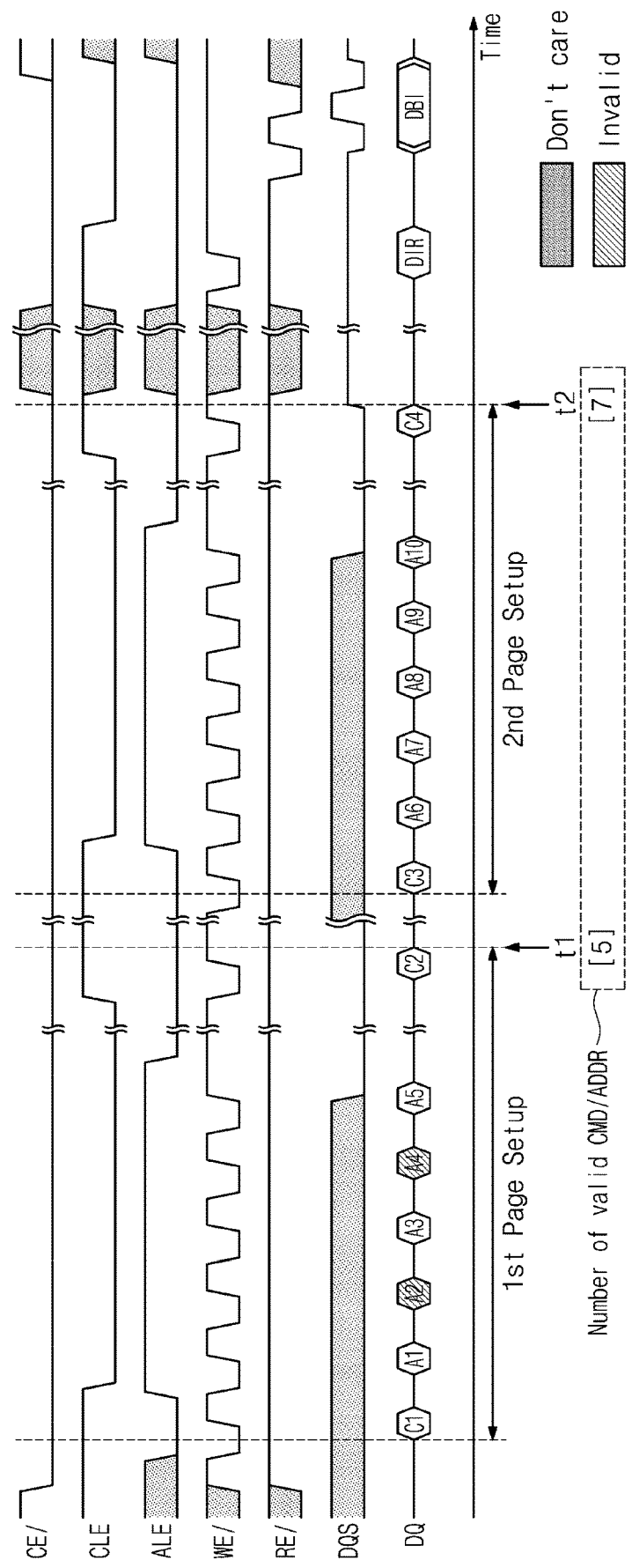
FIG. 13 illustrates a timing diagram of an operation of providing fourth debugging information.

FIG. 13 illustrates a timing diagram of an operation of providing fourth debugging information. Referring to FIGS. 4, 11, and 13, the validity of the data signal DQ stored in a first page setup period and a second page setup period may be determined through the method described with reference to FIG. 11.

During the first page setup period, the debugging information generator 112 may decode the stored first and second commands C1 and C2 (e.g., "80h" and "10h") and the stored first to fifth addresses A1 to A5 (e.g., "01", "101", "03", "105", and "05") and may compare each of the decoded results with a preset value or range. The debugging information generator 112 may determine that each of the first and second commands C1 and C2 are matched with a corresponding one of preset command values (e.g., "80h" and "10h") corresponding to the page setup operations. The debugging information generator 112 may determine that some addresses A2 and A4 of the first to fifth addresses A1 to A5 exceed a preset range (e.g., "01" to "99"). As such, the debugging information generator 112 may determine the number of valid commands and addresses during the first page setup period as "5" at a first time t1.

During the second page setup period, the debugging information generator 112 may decode the stored third and fourth commands C3 and C4 (e.g., "80h" and "10h") and the stored sixth to tenth addresses A6 to A10 (e.g., "06", "07", "08", "09", and "10") and may compare each of the decoded results with a corresponding preset value or range. The debugging information generator 112 may determine that each of the third and fourth commands C3 and C4 and the sixth to tenth addresses A6 to A10 are matched with the corresponding one of the preset values or ranges. As such, the debugging information generator 112 may determine the number of valid commands and addresses during the second page setup period as "7" at a second time t2. The debugging information register 113 may store "12" as the number of valid commands and addresses accumulated.

In the case where the debugging support circuit 110 receives the debugging information request DIR, the debugging information register 113 may output the number of valid commands/addresses thus stored as the debugging information DBI. The debugging information register 113 may output values of the following table 4 as the fourth debugging information DBI[4].

TABLE 4

| MODE | Debugging Information(DBI) Output |
|------|-----------------------------------|
| MODE[4] | [12] |

Figure 14:
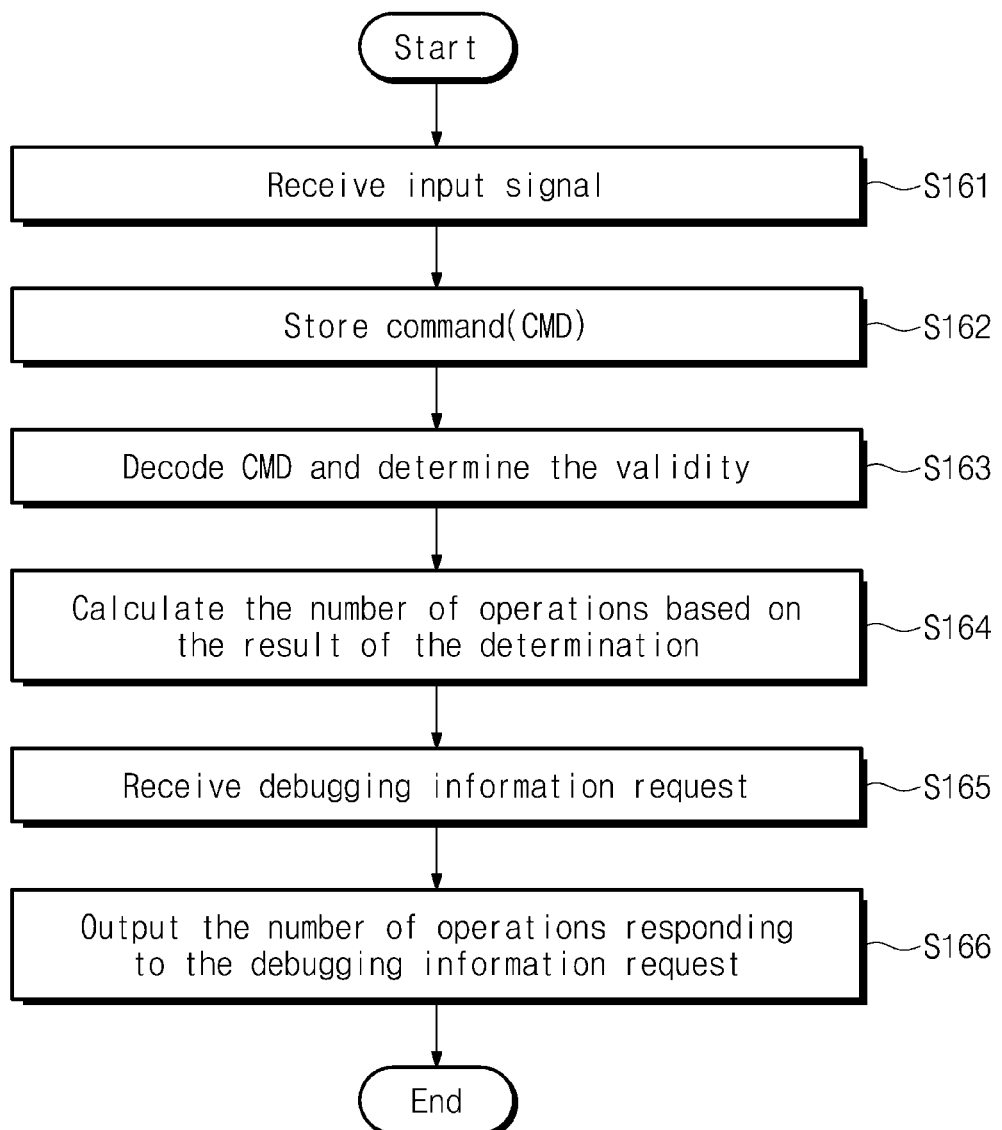
FIG. 14 illustrates a flowchart of an operation method in which the debugging support circuit of FIG. 4 provides fifth debugging information.

FIG. 14 illustrates a flowchart of an operation method in which a debugging support circuit of FIG. 4 provides fifth debugging information. Referring to FIGS. 4 and 14, in operation S161, the debugging support circuit 110 receives an input signal. In operation S162, the debugging support circuit 110 stores the command CMD. In operation S163, the debugging support circuit 110 decodes the command CMD to determine the validity. The debugging support circuit 110 may compare a value indicated by the command CMD with a preset value to determine the validity. In operation S164, the debugging support circuit 110 calculates the number of operations based on the determination result. In an embodiment, the debugging support circuit 110 may calculate the number of operations based on the validity of the command CMD included in the data signal DQ indicating one operation unit. The debugging support circuit 110 may calculate the number of operations for each type of an operation that the command CMD indicates.

In operation S165, the debugging support circuit 110 receives the debugging information request DIR. In operation S166, the debugging support circuit 110 outputs the number of operations as the fifth debugging information DB[5] in response to the debugging information request DIR.

Figure 15:
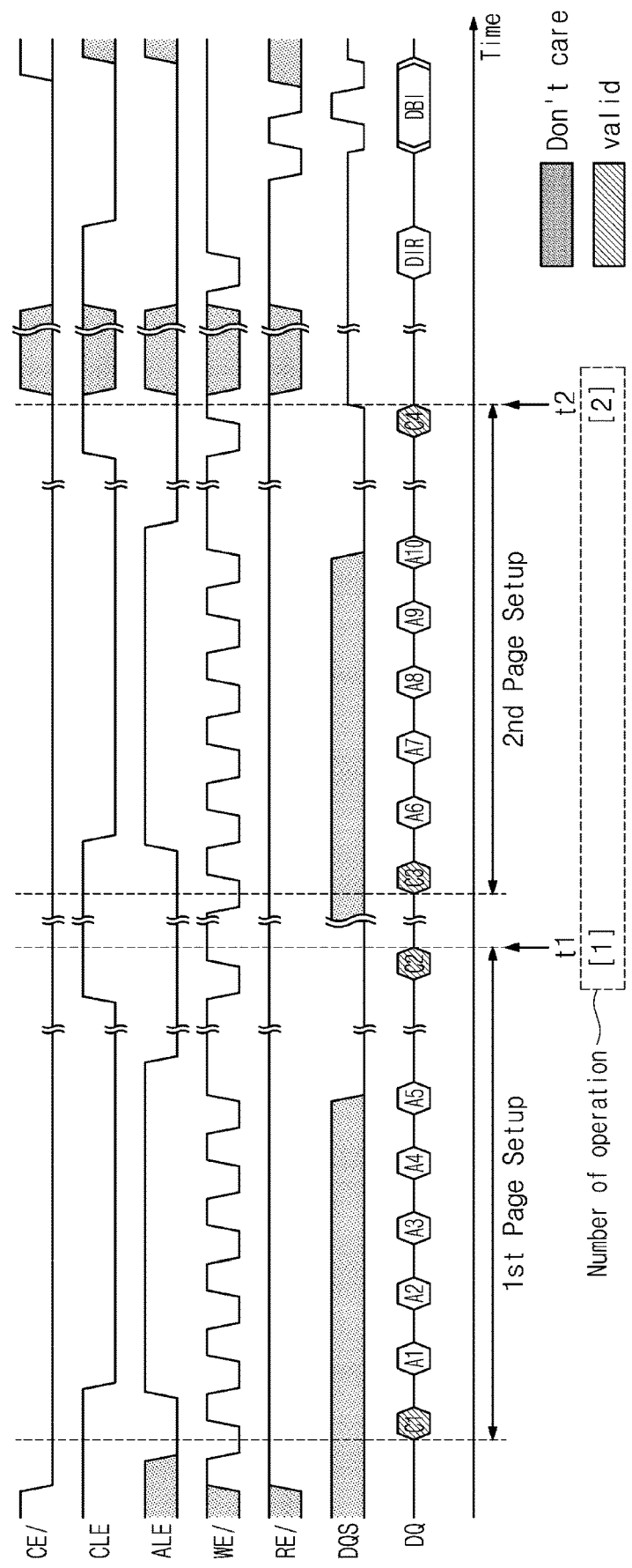
FIG. 15 illustrates a timing diagram of an operation of providing fifth debugging information.

FIG. 15 illustrates a timing diagram of an operation of providing fifth debugging information. Referring to FIGS. 4, 11, and 15, the validity of the data signal DQ stored in a first page setup period (i.e., one operation unit) and a second page setup period (i.e., another operation unit) may be determined through the method described with reference to FIG. 11.

During the first page setup period, the debugging information generator 112 may decode the first and second commands C1 and C2 (e.g., "80h" and "10h") stored. The debugging information generator 112 may determine that the first and second commands C1 and C2 are respectively matched with preset command values (e.g., "80h" and "10h") corresponding to the page setup operation. As such, the debugging information generator 112 may determine the number of operations as "1" at a first time t1.

During the second page setup period, the debugging information generator 112 may decode the third and fourth commands C3 and C4 (e.g., "80h" and "10h") stored. The debugging information generator 112 may determine that the third and fourth commands C3 and C4 are respectively matched with preset command values (e.g., "80h" and "10h") corresponding to the page setup operation. As such, the debugging information generator 112 may determine the number of operations as "2" at a second time t2.

The debugging information generator 112 may calculate or count the number of operations associated with the page setup operation so as to be distinguished from the number of other operations.

The debugging information register 113 may store the number of operations thus calculated. In an embodiment, the debugging information register 113 may store the number of operations for each type of operation. In the case where the debugging support circuit 110 receives the debugging information request DIR, the debugging information register 113 may output the number of operations thus stored as the debugging information DBI. The debugging information register 113 may output values of the following table 5 as the fifth debugging information DBI[5].

TABLE 5

| MODE | Debugging Information(DBI) Output |
|------|-----------------------------------|
| MODE[5] | [2] |

Figure 16:
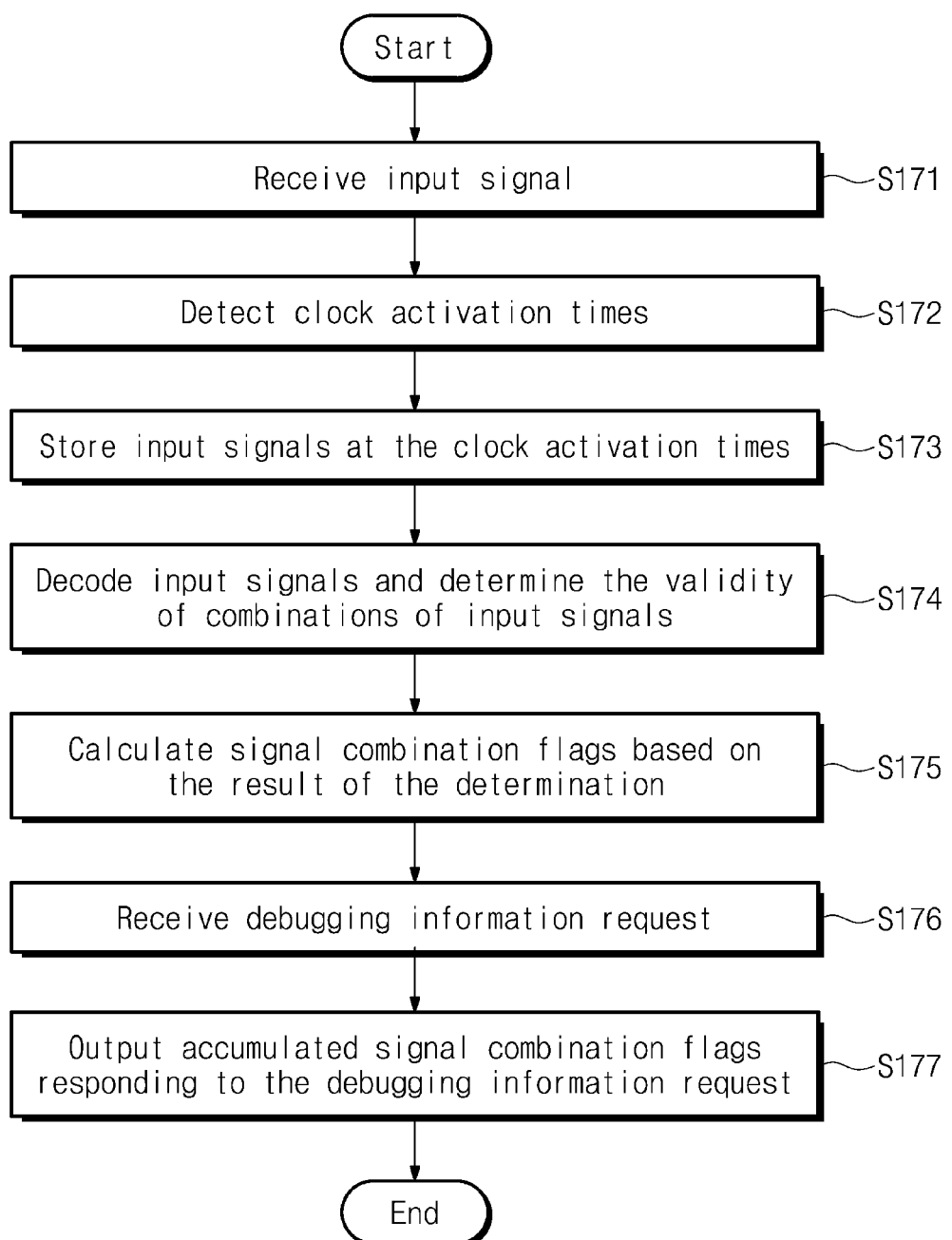
FIG. 16 illustrates a flowchart of an operation method in which the debugging support circuit of FIG. 4 provides sixth debugging information.

FIG. 16 illustrates a flowchart of an operation method in which a debugging support circuit of FIG. 4 provides sixth debugging information. Referring to FIGS. 4 and 16, in operation S171, the debugging support circuit 110 receives an input signal. In operation S172, the debugging support circuit 110 detects clock activation times. For example, the debugging support circuit 110 may detect rising edges of the write enable signal WE/ as clock activation times. In operation S173, the debugging support circuit 110 stores input signals input through different pins at the clock activation times. In operation S174, the debugging support circuit 110 decodes the input signals to determine the validity of combinations of the input signals at the respective clock activation times. The debugging support circuit 110 may compare a combination of values indicated by the input signals at the clock activation times with a combination of preset signal values, and may determine the validity of the combinations based on the comparison results. In operation S175, input signal combination flags are calculated or determined based on the determination results. The debugging support circuit 110 may accumulate and store the input signal combination flags thus calculated.

In operation S176, the debugging support circuit 110 receives the debugging information request DIR. In operation S177, the debugging support circuit 110 outputs the accumulated input signal combination flags as the sixth debugging information DB[6] in response to the debugging information request DIR.

Figure 17:
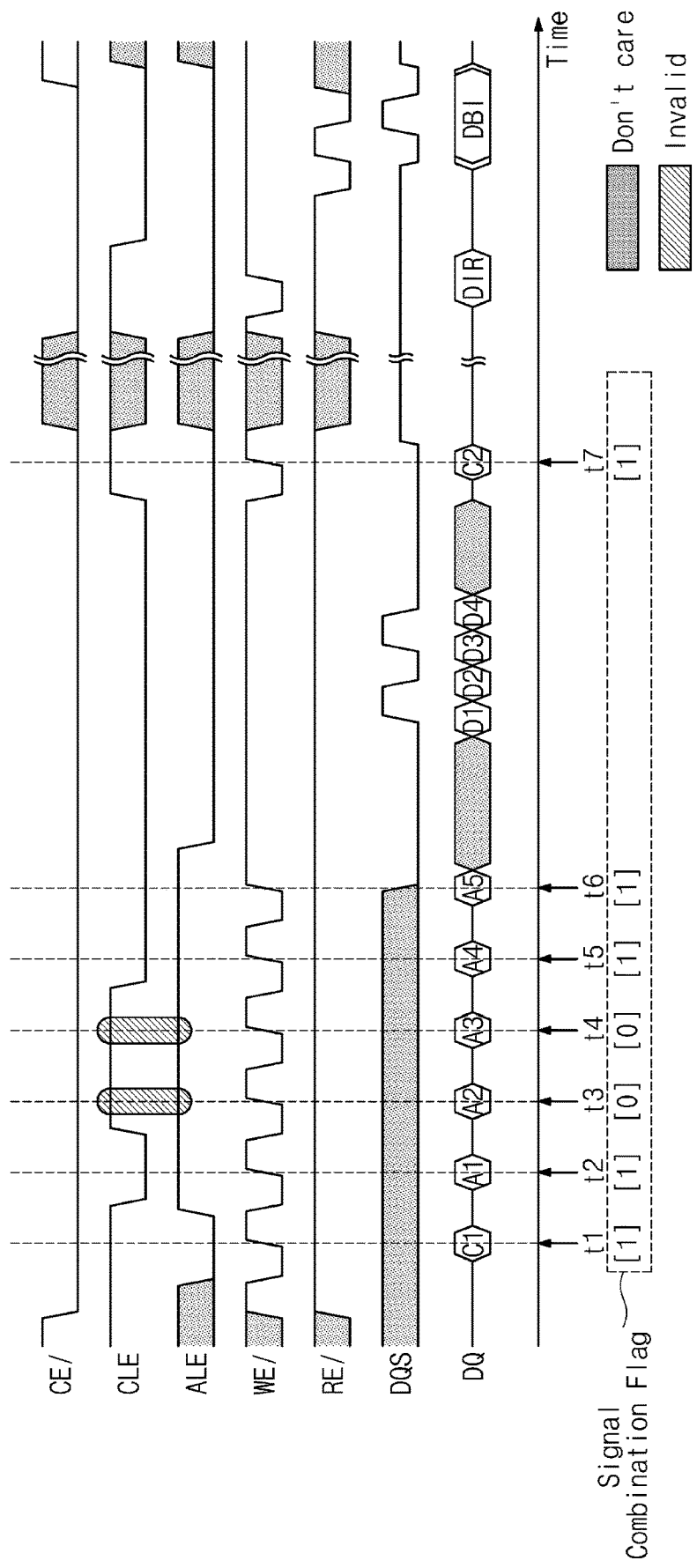
FIG. 17 illustrates a timing diagram of an operation of providing sixth debugging information.

FIG. 17 illustrates a timing diagram of an operation of providing sixth debugging information. Referring to FIGS. 4 and 17, the signal storage circuit 111 may detect clock activation times from an input signal. For example, the storage circuit 111 may detect rising edges of the write enable signal WE/ at first through seventh times t1 to t7 as clock activation times. The signal storage circuit 111 may store input signals respectively input through different pins at the respective detected clock activation times. The signal storage circuit 111 may respectively store input signals at a first time t1 to a seventh time t7 when the rising edges of the write enable signal WE/ are detected. For example, the signal storage circuit 111 may store input signals corresponding to the command latch enable signal CLE, the address latch enable signal ALE, and others of the control signal CTRL and the data signal DQ at the first time t1 as a first combination of input signals. For example, the signal storage circuit 111 may store input signals corresponding to the command latch enable signal CLE, the address latch enable signal ALE, and others of the control signal CTRL and the data signal DQ at the second time t2 as a second combination of input signals. The signal storage circuit 111 may similarly store respective combinations of the input signals at each of the third time t3 to the seventh time t7.

The debugging information generator 112 may determine the validity of the combinations of the input signals stored at each of the first time t1 to the seventh time t7. The debugging information generator 112 may compare the combinations of the input signals stored at each of the first time t1 to the seventh time t7 with a combination of preset input signals and may determine the validity of the combinations of the input signals based on the comparison results. The debugging information generator 112 may compare a combination of the input signals stored at the first time t1, a combination of the input signals stored at the second time t2, a combination of the input signals stored at the fifth time t5, a combination of the input signals stored at the sixth time t6, and a combination of the input signals stored at the seventh time t7 with a combination of preset input signals, and may determine the validity of the combinations of the input signals at these times based on the comparison results. The debugging information register 113 may generate input signal combination flags of "1" at the first time t1, the second time t2, the fifth time t5, the sixth time t6, and the seventh time t7, respectively.

For example, in the case that both the command latch enable signal CLE and the address latch enable signal ALE are at a high level at the third time t3 and the fourth time t4, the debugging information generator 112 may determine that the combination of the input signals stored at the third time t3 and the combination of the input signals stored at the fourth time t4 are invalid, as a result of comparing the combinations of the input signals with a combination of preset input signals. The debugging information register 113 may generate input signal combination flags of "0" at the third time t3 and the fourth time t4, respectively.

In the case where the debugging support circuit 110 receives the debugging information request DIR, the debugging information register 113 may output the stored input signal combination flags as the debugging information DBI. The debugging information register 113 may output values of the following table 6 as the sixth debugging information DBI[6].

TABLE 6

| MODE | Debugging Information(DBI) Output |
|---|---|
| MODE[6] | [1], [1], [0], [0], [1], [1], [1] |

Figure 18:
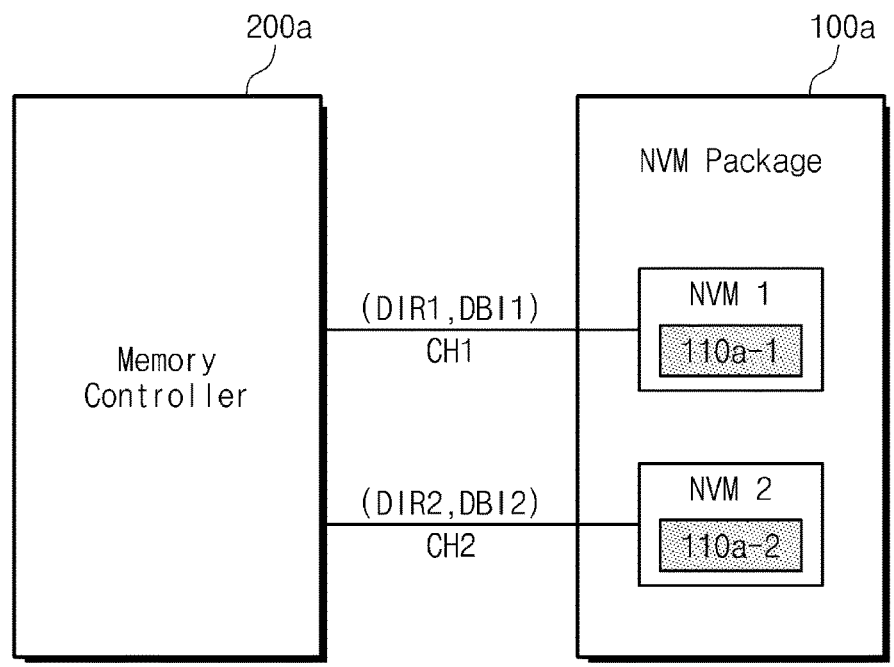
FIG. 18 illustrates a view of the storage device according to another embodiment of the inventive concepts.

FIG. 18 illustrates a view of a storage device according to another embodiment of the inventive concepts. Referring to FIG. 18, storage device 20 includes a nonvolatile memory package 100a and a memory controller 200a. The nonvolatile memory package 100a includes a first nonvolatile memory device NVM1 and a second nonvolatile memory device NVM2. The first nonvolatile memory device NVM1 and the second nonvolatile memory device NVM2 may be connected with the memory controller 200a through different channels CH1 and CH2.

The first nonvolatile memory device NVM1 includes a first debugging support circuit 110a_1, and the second nonvolatile memory device NVM2 includes a second debugging support circuit 110a_2. As described with reference to FIGS. 1 to 17, each of the first debugging support circuit 110a_1 and the second debugging support circuit 110a_2 may generate debugging information DBI from an input signal and may output the generated debugging information DBI in response to a debugging information request DIR. Accordingly, a detailed description associated with the first and second debugging support circuit 110a_1 and 110a_2 is omitted.

In the case that a first debugging information request DIR1 is provided from the memory controller 200a through the first channel CH1, the first debugging support circuit 110a_1 may output first debugging information DBI1 in response to the first debugging information request DIR1. In the case that a second debugging information request DIR2 is provided from the memory controller 200a through the second channel CH2, the second debugging support circuit 110a_2 may output second debugging information DBI2 in response to the second debugging information request DIR2.

That is, the storage device 20 according to an embodiment of the inventive concepts may include the plurality of nonvolatile memory devices NVM1 and NVM2, and the nonvolatile memory devices NVM1 and NVM2 may include the debugging support circuits 110a_1 and 110a_2, respectively. The debugging support circuits 110a_1 and 110a_2 may generate the pieces of debugging information DBI respectively associated with the nonvolatile memory devices NVM1 and NVM2, and the pieces of debugging information DBI may be provided to a host (not illustrated) through the memory controller 200a.

Figure 19:
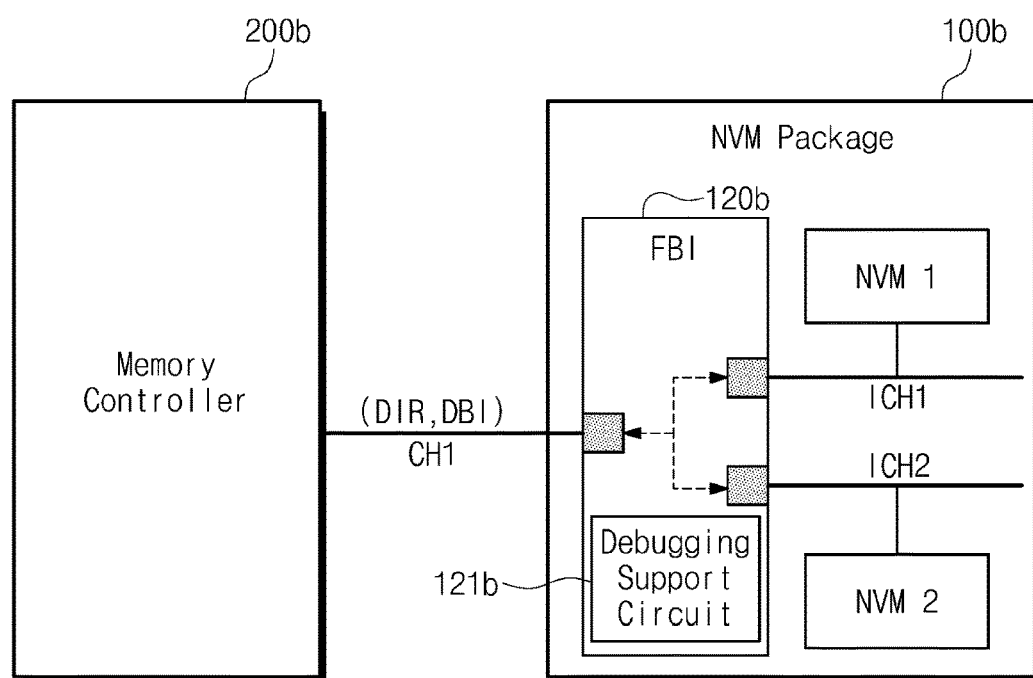
FIG. 19 illustrates a view of the storage device according to a still further embodiment of the inventive concepts.

FIG. 19 illustrates a view of a storage device according to a still further embodiment of the inventive concepts. Referring to FIG. 19, a storage device 30 includes a nonvolatile memory package 100b and a memory controller 200b. The nonvolatile memory package 100b includes a first nonvolatile memory device NVM1, a second nonvolatile memory device NVM2, and an interface chip (FBI) 120b.

The interface chip 120b may be connected with the memory controller 200b through a channel CH1 and may be connected with the nonvolatile memory devices NVM1 and NVM2 through a plurality of internal channels ICH1 and ICH2. The interface chip 120b may transmit signals input through the channel CH1 to one of the nonvolatile memory devices NVM1 and NVM2 through one of the internal channels ICH1 and ICH2. The interface chip 120b may receive signals provided from the nonvolatile memory devices NVM1 and NVM2 through the internal channels ICH1 and ICH2 and may transmit the received signals to the memory controller 200b through the channel CH1.

The interface chip 120b may include a debugging support circuit 121b. As described with reference to FIGS. 1 to 17, the debugging support circuit 121b may generate debugging information DBI from an input signal and may output the generated debugging information DBI in response to a debugging information request DIR. Accordingly, a detailed description associated with the debugging support circuit 121b is omitted.

The debugging support circuit 121b may generate the debugging information DBI associated with the first nonvolatile memory device NVM1 from signals provided to the first nonvolatile memory device NVM1 through the channel CH1. Upon receiving the debugging information request DIR for the first nonvolatile memory device NVM1, the debugging support circuit 121b may output the debugging information DBI associated with the first nonvolatile memory device NVM1.

The debugging support circuit 121b may generate the debugging information DBI associated with the second nonvolatile memory device NVM2 from signals provided to the second nonvolatile memory device NVM2 through the channel CH1. Upon receiving the debugging information request DIR for the second nonvolatile memory device NVM2, the debugging support circuit 121b may output the debugging information DBI associated with the second nonvolatile memory device NVM2.

Accordingly, the storage device 30 according to an embodiment of the inventive concepts may output the debugging information DBI associated with the nonvolatile memory devices NVM1 and NVM2 using the one debugging support circuit 121b.

According to an embodiment of the inventive concepts, the debugging support circuit 121b included in the interface chip 120b may generate debugging information from signals provided through the channel CH1, the first internal channel ICH1, or the second internal channel ICH2 and may output the generated debugging information.

Figure 20:
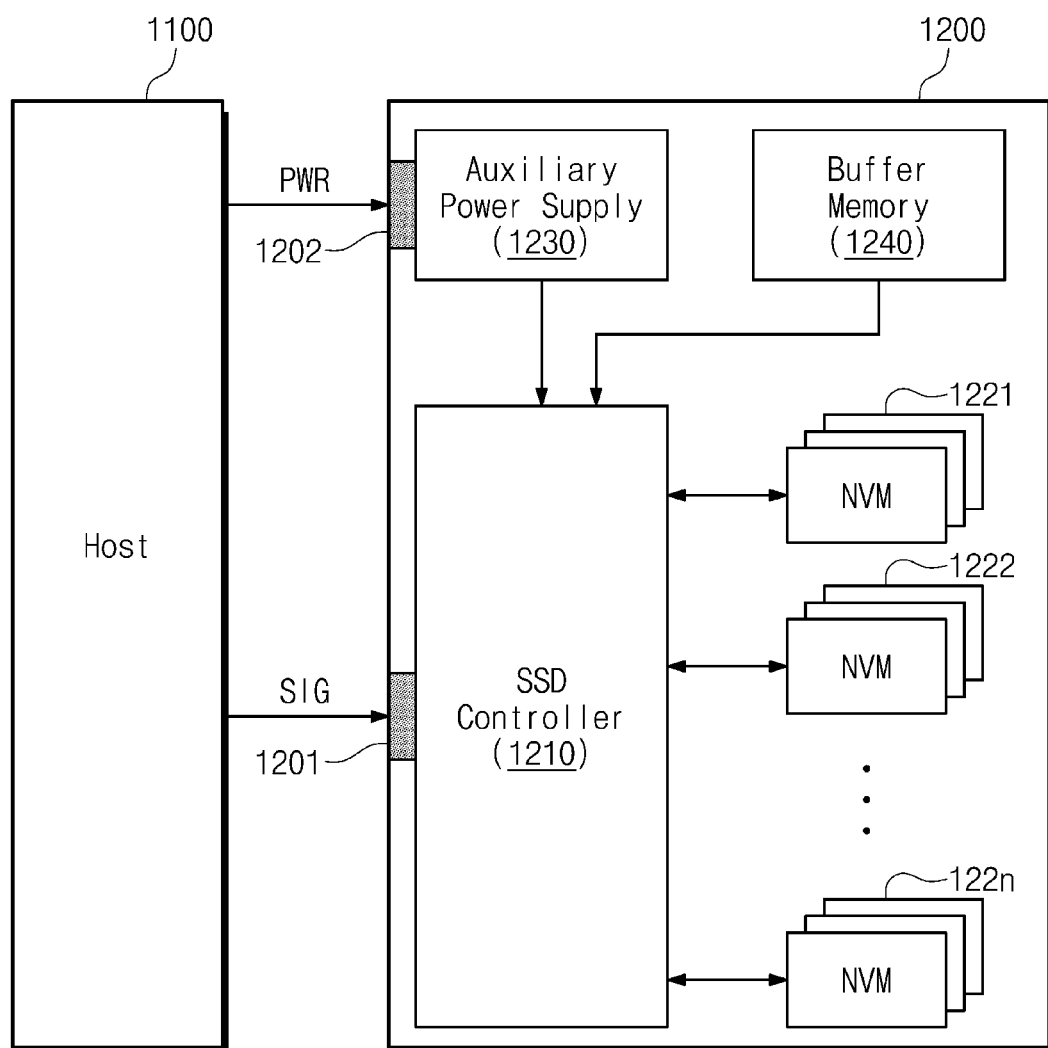
FIG. 20 illustrates a block diagram of a solid state drive system to which the nonvolatile memory device according to the inventive concepts is applied.

FIG. 20 illustrates a block diagram of a solid state drive (SSD) system to which a nonvolatile memory device according to the inventive concepts is applied. Referring to FIG. 20, an SSD system 1000 includes a host 1100 and an SSD 1200.

The SSD 1200 exchanges signals SIG with the host 1100 through a signal connector 1201 and is supplied with power PWR through a power connector 1202. The SSD 1200 includes an SSD controller 1210, a plurality of flash memory units 1221 to 122n, an auxiliary power supply 1230, and a buffer memory 1240.

The SSD controller 1210 may control the flash memory units 1221 to 122n in response to the signal SIG from the host 1100. The flash memory units 1221 to 122n may operate under control of the SSD controller 1210. The auxiliary power supply 1230 is connected with the host 1100 through the power connector 1202. The auxiliary power supply 1230 may be charged by the power PWR from the host 1100. When the power PWR is not smoothly supplied from the host 1100, the auxiliary power supply 1230 may power the SSD system 1200. The buffer memory 1240 operates as a buffer memory of the SSD 1200.

In an embodiment, each of the flash memory units 1221 to 122n may include a debugging support circuit described with reference to FIGS. 1 to 20. The debugging support circuit may be included in a nonvolatile memory device, which is included in each of the flash memories 1221 to 122n. Alternatively, the debugging support circuit may be included in an interface chip included in each of the flash memory units 1221 to 122n. The SSD controller 1210 may receive a debugging information request from the host 1100 and may transmit the debugging information request to each of the flash memory units 1221 to 122n. The debugging support circuit(s) may generate debugging information associated with a nonvolatile memory devices and may output the generated debugging information to the SSD controller 1210. The host 1100 may determine whether a problem arises from an interface between the SSD controller and the flash memory units 1221 and 122n, based on the debugging information received from the SSD controller 1210.

Figure 21:
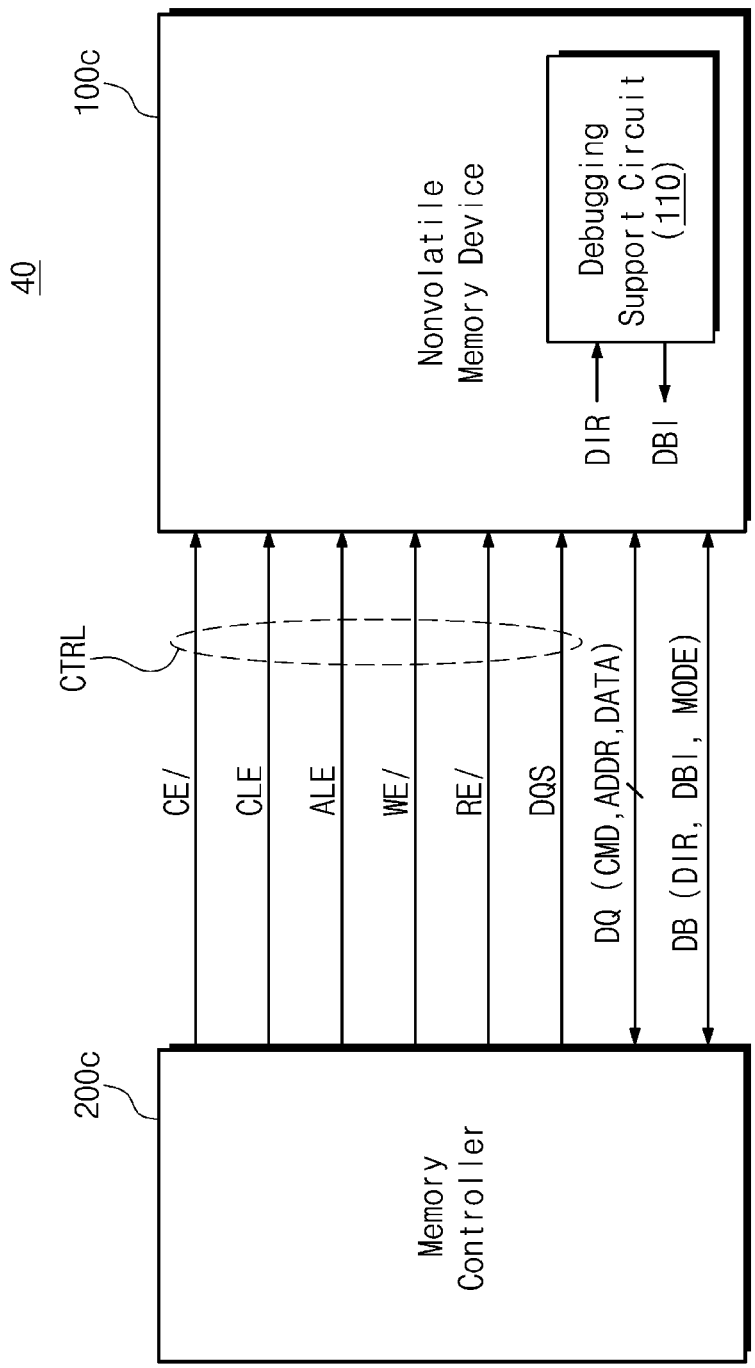
FIG. 21 illustrates a view of a storage device according to a still further embodiment of the inventive concepts.

FIG. 21 illustrates a view of a storage device according to a still further embodiment of the inventive concepts. Referring to FIG. 21, a storage device 40 includes a nonvolatile memory device 100c and a memory controller 200c. The nonvolatile memory includes a debugging support circuit 110. Except for some points discussed below, the nonvolatile memory device 100c and the memory controller 200c may have identical structures and be configured to operate identically.

As some different points from the storage device 10, the nonvolatile memory device 100c and the memory controller 200c communicate debug information request DIR, debugging information DBI and debugging mode MODE as debug signal DB carried through signal line(s) and/or pin(s) different from signal line(s) and/or pin(s) carrying data signal DQ. That is, the storage device 40 may have line(s) and/or pin(s) designated to carry the debug information request DIR, the debugging information DBI and the debugging mode MODE.

Figure 22:
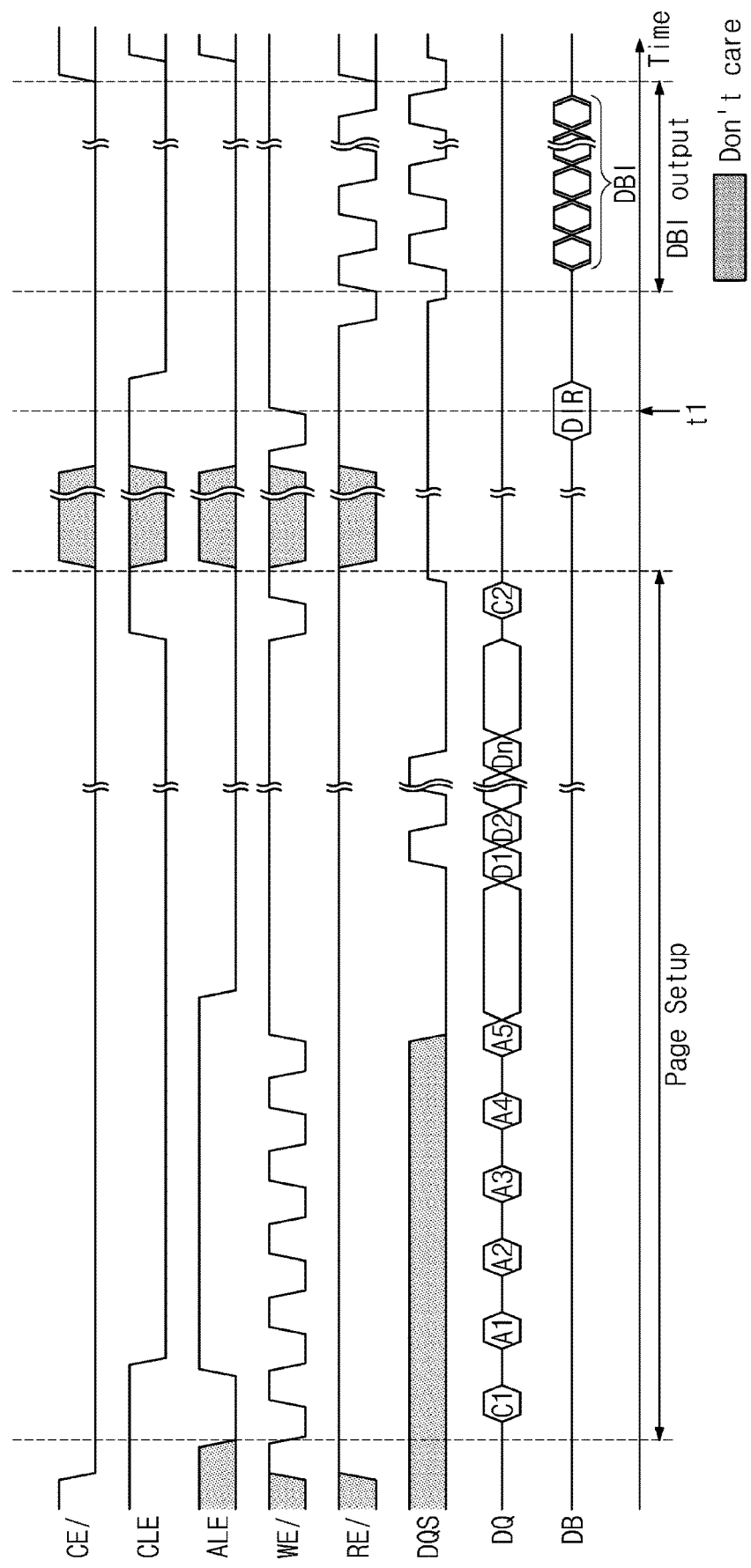
FIG. 22 illustrates a timing diagram of a debugging information providing operation of a nonvolatile memory device of FIG. 21.

FIG. 22 illustrates a timing diagram of a debugging information providing operation of a nonvolatile memory device of FIG. 21. For a brief description and for brevity of illustration, a program sequence will be described with reference to signals provided to the nonvolatile memory device 100c of FIG. 21. However, in other embodiments the debugging information providing operation may be performed with respect to a reading operation or other operation. For brevity of illustration, the respective signals are schematically illustrated, but the inventive concepts are not limited thereto.

Comparing FIG. 3 with respect to the nonvolatile memory device 100, FIG. 22 illustrates that debug signal DB is carried through signal line(s) and/or pad(s) different from the signal line(s) and/or pad(s) carrying the data signal DQ. Expressions for other signal in FIG. 22 which are identical with signal in FIG. 3 are omitted.

Figure 23:
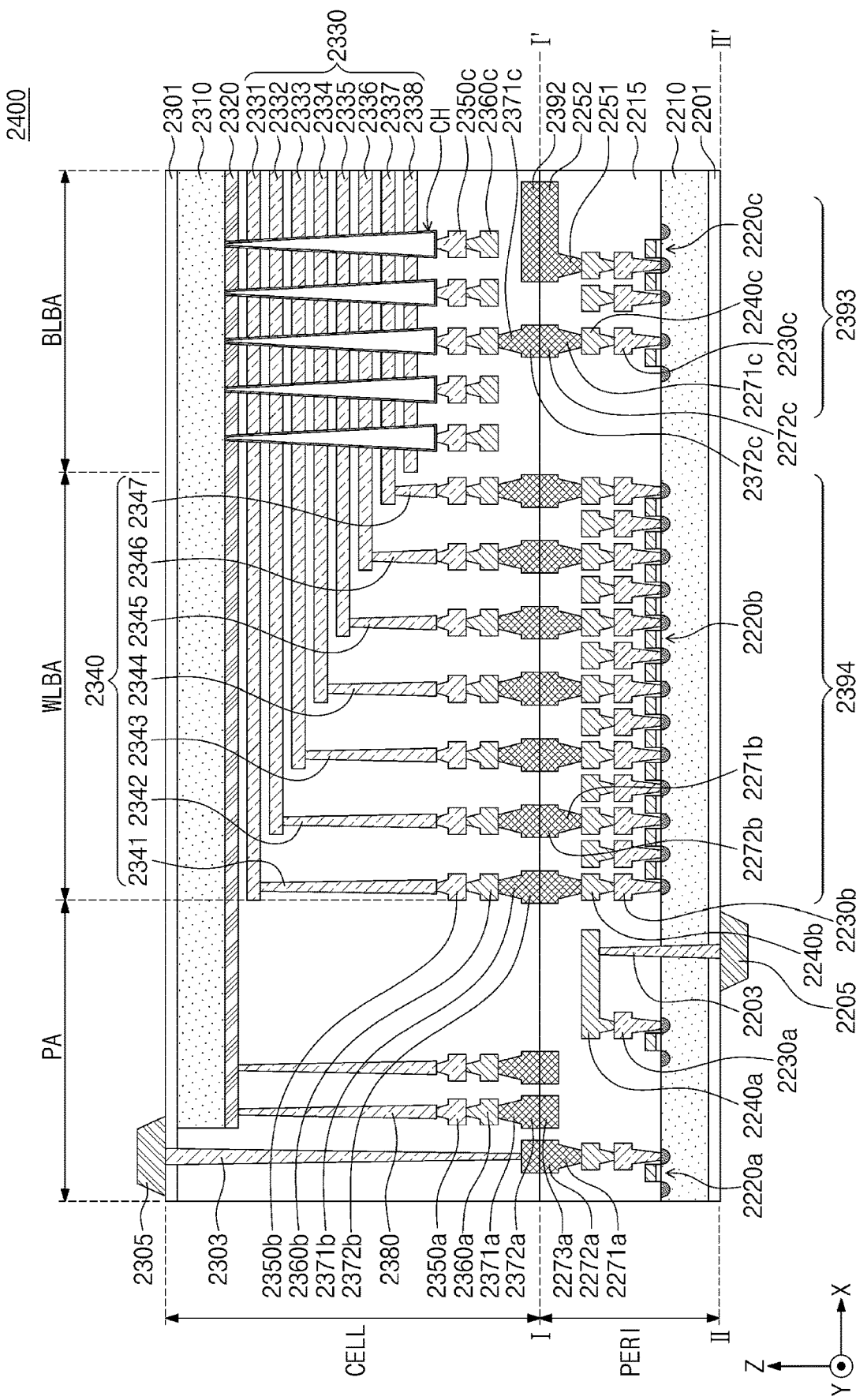
FIG. 23 is a diagram illustrating an exemplary nonvolatile memory device.

FIG. 23 is a diagram illustrating an exemplary nonvolatile memory device. The nonvolatile memory device in FIG. 23 may correspond to one of the nonvolatile memory devices 100 and 100c and the nonvolatile memory packages 100a and 100c. Referring to FIG. 23, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230*a*, 2230*b*, and 2230*c* may be formed of tungsten having relatively high resistance, and the second metal layers 2240*a*, 2240*b*, and 2240*c* may be formed of copper having relatively low resistance.

In an example embodiment illustrate in FIG. 23, although the first metal layers 2230*a*, 2230*b*, and 2230*c* and the second metal layers 2240*a*, 2240*b*, and 2240*c* are shown and described, they are not limited thereto, and one or more metal layers may be further formed on the second metal layers 2240*a*, 2240*b*, and 2240*c*. At least a portion of the one or more metal layers formed on the second metal layers 2240*a*, 2240*b*, and 2240*c* may be formed of aluminum or the like having a lower resistance than those of copper forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the word line bonding area WLBA. In the word line bonding area WLBA, the lower bonding metals 2271*b* and 2272*b* in the peripheral circuit region PERI may be electrically connected to upper bonding metals 2371*b* and 2372*b* in the cell region CELL in a bonding manner, and the lower bonding metals 2271*b* and 2272*b* and the upper bonding metals 2371*b* and 2372*b* may be formed of aluminum, copper, tungsten, or the like.

Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

Widths of the plurality of word lines 2330 along the X-direction may be different each other. As a distance from the first substrate 2210 of the peripheral circuit region PERI to respective one of the plurality of word line 2330 increases, the width of the respective one of the plurality of word line 2330 decreases. Similarly, as a distance from the second substrate 2310 of the cell region CELL to respective one of the plurality of word line 2330 increases, the width of the respective one of the plurality of word line 2330 increases.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350*c* and a second metal layer 2360*c*. For example, the first metal layer 2350*c* may be a bit line contact, and the second metal layer 2360*c* may be a bit line. In an example embodiment, the bit line 2360*c* may extend in a first direction (a Y-axis direction), parallel to the upper surface of the second substrate 2310.

In an example embodiment illustrated in FIG. 23, an area in which the channel structure CH, the bit line 2360*c*, and the like are disposed may be defined as the bit line bonding area BLBA. In the bit line bonding area BLBA, the bit line 2360*c* may be electrically connected to the circuit elements 2220*c* providing a page buffer 2393 in the peripheral circuit region PERI. For example, the bit line 2360*c* may be connected to upper bonding metals 2371*c* and 2372*c* in the cell region CELL, and the upper bonding metals 2371*c* and 2372*c* may be connected to lower bonding metals 2271*c* and 2272*c* connected to the circuit elements 2220*c* of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350*b* and a second metal layer 2360*b* may be connected to an upper portion of the plurality of cell contact plugs 2340 connected to the plurality of word lines 2330, sequentially. The plurality of cell contact plugs 2340 may be connected to the circuit region PERI by the upper bonding metals 2371*b* and 2372*b* of the cell region CELL and the lower bonding metals 2271*b* and 2272*b* of the peripheral circuit region PERI in the word line bonding area WLBA.

The plurality of cell contact plugs 2340 may be electrically connected to the circuit elements 2220*b* providing a row decoder 2394 in the peripheral circuit region PERI. In an example embodiment, operating voltages of the circuit elements 2220*b* providing the row decoder 2394 may be different than operating voltages of the circuit elements 2220*c* providing the page buffer 2393. For example, operating voltages of the circuit elements 2220*c* providing the page buffer 2393 may be greater than operating voltages of the circuit elements 2220*b* providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input-output pads 2205 and 2305 may be disposed in the external pad bonding area PA. Referring to FIG. 23, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220*a*, 2220*b*, and 2220*c* disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 23, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220*a*, 2220*b*, and 2220*c* disposed in the peripheral circuit region PERI through a second input-output contact plug 2303.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 23, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305 and the lower bonding metals 2271*a* and 2272*a* of the peripheral circuit area PERI.

According to embodiments, the first input-output pad 2205 and the second input-output pad 2305 may be selectively formed. For example, the memory device 4 2400 may include only the first input-output pad 2205 disposed on the first substrate 2210 or the second input-output pad 2305 disposed on the second substrate 2310. Alternatively, the memory device 4 2400 may include both the first input-output pad 2205 and the second input-output pad 2305.

The first input-output pad 2205 and the second input-output pad 2305 may be used to communicate signal with an external of the nonvolatile memory device 2400. The first input-output pad 2205 and the second input-output pad 2305 may include a plurality of input-output pads. The first part of the plurality of input-output pads may communicate the data signal DQ between the external of the nonvolatile memory device 2400 and the page buffer 2393. The first part of the plurality of input-output pads may communicate the address ADDR between the external of the nonvolatile memory device 2400 and the row decoder 2394. The first part of the plurality of input-output pads may communicate the command CMD between the external of the nonvolatile memory device 2400 and an internal circuit of the peripheral circuit region PERI.

The second part of the plurality of input-output pads may communicate the control signal CTRL including the chip enable signal CE/, the command latch enable signal CLE, the address latch enable signal ALE, the write enable signal WE/, the read enable signal RE/, and the data strobe signal DQS between the external of the nonvolatile memory device 2400 and the internal circuit of the peripheral circuit region PERI. The third part of the plurality of input-output pads may communicate the debug signal including the debug information request DIR, the debug information DBI, and/or the debugging mode MODE between the external of the nonvolatile memory device 2400 and the internal circuit of the peripheral circuit region PERI. In alternative embodiment, the first part of the plurality of input-output pads may communicate the debug signal including the debug information request DIR, the debug information DBI, and/or the debugging mode MODE between the external of the nonvolatile memory device 2400 and the internal circuit of the peripheral circuit region PERI.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 4 2400 may include a lower metal pattern 2273*a*, corresponding to an upper metal pattern 2372*a* formed in an uppermost metal layer of the cell region CELL, and having the same shape as the upper metal pattern 2372*a* of the cell region CELL, in an uppermost metal layer of the peripheral circuit region PERI. In the peripheral circuit region PERI, the lower metal pattern 2273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271*b* and 2272*b* may be formed on the second metal layer 2240*b* in the word line bonding area WLBA. In the word line bonding area WLBA, the lower bonding metals 2271*b* and 2272*b* of the peripheral circuit region PERI may be electrically connected to the upper bonding metals 2371*b* and 2372*b* of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In an example embodiment, the debugging support circuit 110 may be implemented in the peripheral circuit region PERI. The input-output pads 2205 and/or 2305 may carry the debug signal DB. The input-output pads 2205 and/or 2305 may be connected to the controller 200*c* to carry the debug signal DB.

According to the above-described embodiments of the inventive concepts, the nonvolatile memory device may generate debugging information from an input signal and may provide the generated debugging information to the host. Accordingly, even though a memory controller and a nonvolatile memory device are combined to form one set or device, a host may easily determine whether a problem arises from an interface between the memory controller and the nonvolatile memory device.

According to the inventive concepts, a nonvolatile memory device may generate debugging information based on an input signal provided from a memory controller and may output the generated debugging information. Accordingly, a nonvolatile memory device and an operation method thereof, which are capable of detecting a failure cause of a storage device associated with the nonvolatile memory device, are provided.

While the inventive concepts have been described with reference to exemplary embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
a memory cell region including first metal pads; and
a peripheral circuit region including:
  second metal pads;
  a signal storage circuit configured to store control signals and a data signal received from external of the nonvolatile memory device;
  a debugging information generator configured to generate debugging information based on the stored control signals and the stored data signal; and
  a debugging information register configured to output the debugging information in response to a debugging information request from external of the nonvolatile memory device,
wherein the peripheral circuit region is vertically connected to the memory cell region by the first metal pads and the second metal pads.

2. The nonvolatile memory device of claim 1, wherein the memory cell region further comprises:
a first input-output pad on the memory cell region; and
a third metal pad under the substrate and connected to the first input-output pad,
wherein the peripheral circuit region further comprises:
  a fourth metal pad connecting the third metal pad and the debugging information register,
wherein the debugging information request is received at the debugging information register from the external of the nonvolatile memory device through the first input-output pad, the third metal pad and the fourth metal pad.

3. The nonvolatile memory device of claim 2, wherein the memory cell region further comprises:
a second input-output pad on the memory cell region; and
a fifth metal pad under the substrate and connected to the second input-output pad,
wherein the peripheral circuit region further comprises a sixth metal pad, and
wherein the signal storage circuit communicate the data signal with the external of the nonvolatile memory device through the second input-output pad, the fifth metal pad and the sixth metal pad.

4. The nonvolatile memory device of claim 3, wherein the signal storage circuit communicate the control signal and address signal with the external of the nonvolatile memory device through the second input-output pad, the fifth metal pad and the sixth metal pad.

5. The nonvolatile memory device of claim 1, wherein the memory cell region further comprises:
a first input-output pad on the memory cell region; and
a third metal pad under the substrate and connected to the first input-output pad,
wherein the peripheral circuit region further comprises:
  a fourth metal pad connecting the third metal pad and the debugging information register,
wherein the debugging information is output by the debugging information register to the external of the nonvolatile memory device through the fourth metal pad, the third metal pad and the first input-output pad.

6. The nonvolatile memory device of claim 5, wherein the memory cell region further comprises:
a second input-output pad on the memory cell region; and
a fifth metal pad under the substrate and connected to the second input-output pad,
wherein the peripheral circuit region further comprises a sixth metal pad, and
wherein the signal storage circuit communicate the data signal with the external of the nonvolatile memory device through the second input-output pad, the fifth metal pad and the sixth metal pad.

7. The nonvolatile memory device of claim 6, wherein the signal storage circuit communicate the control signal and address signal with the external of the nonvolatile memory device through the second input-output pad, the fifth metal pad and the sixth metal pad.

8. The nonvolatile memory device of claim 1, wherein the debugging information request includes a debugging mode, and wherein the debugging information comprises information corresponding to the debugging mode.

9. The nonvolatile memory device of claim 1, wherein the signal storage circuit stores the data signal as the debugging information when a rising edge of a write enable signal included in the control signals is detected.

10. The nonvolatile memory device of claim 1, wherein the signal storage circuit is further configured to:
store a first value as the debugging information when a command latch enable signal included in the control signals is at a high level and a rising edge of a write enable signal included in the control signals is detected; and
store a second value as the debugging information when an address latch enable signal included in the control signals is at a high level and another rising edge of the write enable signal included in the control signals is detected.

11. The nonvolatile memory device of claim 10, wherein the signal storage circuit stores a third value as the debugging information when a rising edge or a falling edge of a data strobe signal included in the control signals is detected.

12. The nonvolatile memory device of claim 1, wherein the debugging information is generated by:
determining a validity of a command and an address included in the data signal based on a preset value; and
generating a value corresponding to the determined validity as the debugging information.

13. The nonvolatile memory device of claim 1, wherein the debugging information is generated by:
determining a validity of a command included in the data signal and a validity of an address included in the data signal based on preset values; and
generating a number of valid commands and a number of valid addresses as the debugging information based on the determined validities.

14. The nonvolatile memory device of claim 1, wherein the debugging information is generated by:
determining a validity of a command included in the data signal based on a preset value; and
calculating a number of valid operations corresponding to the command as the debugging information based on the determined validity.

15. The nonvolatile memory device of claim 1, wherein the first metal pads and the second metal pads are formed of copper.

16. The nonvolatile memory device of claim 1, wherein the first metal pads and the second metal pads are connected by bonding manner.

17. The nonvolatile memory device of claim 1, wherein the memory cell region is formed on a first wafer and the peripheral circuit region is formed on a second wafer.

18. The nonvolatile memory device of claim 1, wherein the peripheral circuit region further includes:
　a substrate on which the signal storage circuit, the debugging information generator and the debugging information register are provided,
　wherein the memory cell region further includes:
　　a plurality of memory cells; and
　　a plurality of word lines connected to the plurality of memory cells,
　wherein as a distance between one of the plurality of word lines and the substrate of the peripheral circuit region increases, a width of the one of the plurality of word lines increases.

19. The nonvolatile memory device of claim 1, wherein the memory cell region further includes:
　a plurality of memory cells; and
　a plurality of word lines connected to the plurality of memory cells and connected to the first metal pads,
　wherein the peripheral circuit region further includes:
　　a row decoder connected to the second metal pads,
　wherein the plurality of word lines in the memory cell region are connected to the row decider through the first metal pads and the second metal pads.

20. The nonvolatile memory device of claim 1, wherein the memory cell region further includes:
　a plurality of memory cells; and
　a plurality of bit lines connected to the plurality of memory cells and connected to the first metal pads,
　wherein the peripheral circuit region further includes:
　　a page buffer connected to the second metal pads,
　wherein the plurality of word lines in the memory cell region are connected to the page buffer through the first metal pads and the second metal pads.

* * * * *